(12) United States Patent
Ono

(10) Patent No.: US 10,691,002 B2
(45) Date of Patent: *Jun. 23, 2020

(54) IMAGING DEVICE AND IMAGE DATA GENERATION METHOD

(71) Applicant: FUJIFILM Corporation, Tokyo (JP)

(72) Inventor: Shuji Ono, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 79 days.

This patent is subject to a terminal disclaimer.

(21) Appl. No.: 16/013,942

(22) Filed: Jun. 21, 2018

(65) Prior Publication Data

US 2018/0299754 A1    Oct. 18, 2018

Related U.S. Application Data

(63) Continuation of application No. PCT/JP2016/086289, filed on Dec. 7, 2016.

(30) Foreign Application Priority Data

Jan. 18, 2016 (JP) .................................. 2016-007049

(51) Int. Cl.
*G03B 19/07* (2006.01)
*H04N 5/232* (2006.01)
(Continued)

(52) U.S. Cl.
CPC .............. *G03B 19/07* (2013.01); *G06T 5/002* (2013.01); *H04N 5/22541* (2018.08);
(Continued)

(58) Field of Classification Search
CPC ........ G03B 19/07; G03B 17/17; G03B 15/00; G03B 11/00; H04N 5/359; H04N 5/232;
(Continued)

(56) References Cited

U.S. PATENT DOCUMENTS 8,325,241 B2 * 12/2012 Yoshioka ............. H04N 5/2254
348/207.99
8,605,197 B2 * 12/2013 Ono ......................... G02B 3/14
348/222.1
(Continued)

FOREIGN PATENT DOCUMENTS

EP       2750374       7/2014
JP    2014178190       9/2014
(Continued)

OTHER PUBLICATIONS

"International Search Report (Form PCT/ISA/210) of PCT/JP2016/086289", dated Feb. 21, 2017, with English translation thereof, pp. 1-5.

(Continued)

*Primary Examiner* — Pritham D Prabhakher
(74) *Attorney, Agent, or Firm* — JCIPRNET

(57) ABSTRACT

Provided are an imaging device and an image data generation method which are capable of reducing noise generated in an image in which crosstalk is removed. In an imaging device (1) that captures images corresponding to optical systems at one time by using an imaging lens (10) including a plurality of optical system of which imaging characteristics are different and an image sensor (100) including a plurality of light receiving sensors of which crosstalk ratios are different in each pixel, the number (m) of light receiving sensors included in each pixel of the image sensor (100) is larger than the number (n) of optical systems included in the imaging lens (10) (m>n). Accordingly, it is possible to reduce noise generated in an image in which crosstalk is removed.

20 Claims, 34 Drawing Sheets

(51) Int. Cl.
*H04N 5/357* (2011.01)
*H04N 5/225* (2006.01)
*G06T 5/00* (2006.01)
*H04N 5/359* (2011.01)

(52) U.S. Cl.
CPC ......... *H04N 5/232* (2013.01); *H04N 5/23229* (2013.01); *H04N 5/357* (2013.01); *H04N 5/359* (2013.01); *H04N 5/2254* (2013.01)

(58) Field of Classification Search
CPC .. H04N 5/2254; H04N 5/23229; H04N 5/357; H04N 5/22541; H04N 5/3597; H04N 5/2353; H04N 5/37452; H04N 5/2258; H04N 5/23238; H04N 5/35563; G06T 5/002; G06T 5/50; G06T 2207/10052; G06T 2207/20221
USPC ...................................................... 348/222.1
See application file for complete search history.

(56) References Cited

U.S. PATENT DOCUMENTS

| | | | | |
|---|---|---|---|---|
| 8,836,844 | B2* | 9/2014 | Hiasa | G02B 7/346 348/340 |
| 9,438,778 | B2* | 9/2016 | Chang | H04N 5/2254 |
| 2009/0190016 | A1* | 7/2009 | Iida | H01L 27/1464 348/308 |
| 2013/0057749 | A1* | 3/2013 | Hiasa | G02B 7/346 348/340 |
| 2013/0083233 | A1 | 4/2013 | Fukami | |
| 2013/0222676 | A1* | 8/2013 | Ono | G02B 3/14 348/345 |
| 2014/0139645 | A1 | 5/2014 | Ono | |
| 2014/0152779 | A1* | 6/2014 | Ono | H04N 5/3696 348/49 |
| 2014/0168498 | A1* | 6/2014 | Ono | G02B 7/38 348/335 |
| 2014/0267622 | A1 | 9/2014 | Kasahara | |
| 2015/0009369 | A1 | 1/2015 | Ono | |
| 2015/0156478 | A1* | 6/2015 | Ono | H04N 13/282 348/49 |
| 2015/0192758 | A1 | 7/2015 | Yamagata et al. | |
| 2016/0044216 | A1* | 2/2016 | Chang | G02B 27/0075 348/360 |
| 2016/0126269 | A1* | 5/2016 | Fujita | H01L 27/14663 250/208.1 |
| 2016/0173835 | A1* | 6/2016 | Cha | H04N 9/045 348/280 |
| 2016/0191826 | A1* | 6/2016 | Furuya | H04N 5/217 348/246 |
| 2016/0227112 | A1 | 8/2016 | Ono | |
| 2016/0269667 | A1 | 9/2016 | Ono | |
| 2016/0343114 | A1* | 11/2016 | Lin | G06T 5/50 |

FOREIGN PATENT DOCUMENTS

| | | |
|---|---|---|
| JP | 2015046691 | 3/2015 |
| WO | 2013018471 | 2/2013 |
| WO | 2013027488 | 2/2013 |
| WO | 2013146506 | 10/2013 |
| WO | 2015093332 | 6/2015 |

OTHER PUBLICATIONS

"Written Opinion of the International Searching Authority of PCT/JP2016/086289" with English translation thereof, dated Feb. 21, 2017, p. 1-p. 7.
Wikipedia, "Moore-Penrose inverse," Retrieved on Oct. 30, 2018, Available at: https://en.wikipedia.org/w/index.php?title=Moore-Penrose_inverse&oldid=692336288.
"Search Report of Europe Counterpart Application", dated Nov. 14, 2018, p. 1-p. 6.

* cited by examiner $$\begin{bmatrix} A1 \\ A2 \end{bmatrix} = \begin{bmatrix} C11 & C12 \\ C21 & C22 \end{bmatrix} \times \begin{bmatrix} B1 \\ B2 \end{bmatrix}$$

IMAGING DEVICE AND IMAGE DATA GENERATION METHOD

CROSS-REFERENCE TO RELATED APPLICATIONS

This application is a Continuation of PCT International Application No. PCT/JP2016/086289 filed on Dec. 7, 2016, which claims priority under 35 U.S.C § 119(a) to Japanese Patent Application No. 2016-007049 filed on Jan. 18, 2016. Each of the above application(s) is hereby expressly incorporated by reference, in its entirety, into the present application.

BACKGROUND OF THE INVENTION

1. Field of the Invention

The present invention relates to an imaging device and an image data generation method, and particularly, to an imaging device and an image data generation method which are capable of imaging a plurality of images at one time by using an imaging lens including a plurality of optical systems and an image sensor of which each light receiving sensor has directivity for an incidence angle of light.

2. Description of the Related Art

An imaging device capable of imaging a plurality of images at one time by using an imaging lens including a plurality of optical systems and an image sensor of which each light receiving sensor has directivity for an incidence angle of light has been known (for example, WO2013/018471A). In this imaging device, images corresponding to the optical systems are captured by selectively receiving light rays passing through the optical systems of the imaging lens by the light receiving sensors of the image sensor. However, it is difficult to completely distribute and receive the light rays from the optical systems by the light receiving sensors. As a result, crosstalk is caused. The crosstalk is a phenomenon by which light from another optical system is mixed and is received. In a case where the crosstalk is caused, an image on which an image of another optical system is superimposed is captured (see FIGS. 13 and 14). WO2013/146506A and JP2014-178190A suggest a method of removing the influence of the crosstalk from each image through signal processing by using images of the optical systems obtained through the imaging.

SUMMARY OF THE INVENTION

Incidentally, noise is generated in the image obtained through the imaging due to various factors. The noise is a randomly occurring small fluctuation component, and is shown as roughness in the image. As in WO2013/146506A and JP2014-178190A, in a case where the influence of the crosstalk is removed through the signal processing and noise is included in an image as a processing target, there is a problem that the noise influences a processing result.

The present invention has been made in view of such circumstances, and an object of the present invention is to provide an imaging device and an image data generation method which are capable of reducing noise generated in an image in which crosstalk is removed.

Means for solving the problems are as follows.

(1) There is provided an imaging device comprising an imaging lens that includes n number of optical systems of which imaging characteristics are different in which n is an integer satisfying n>1, an image sensor that includes m number of light receiving sensors of which crosstalk ratios are different in each pixel in which m is an integer satisfying m>n, a primary image data generation unit that obtains image signals from the light receiving sensors of each pixel of the image sensor, and generates m number of primary image data items, and a secondary image data generation unit that generates n number of secondary image data items corresponding to the optical systems by performing crosstalk removal processing on the m number of primary image data items for each pixel.

In the related art, in this type of imaging device, the same number of light receiving sensors as the number (n) of optical systems included in the imaging lens are included in each pixel of the image sensor (n=m). For example, in a case where the number (n) of optical systems included in the imaging lens is 2, the number (m) of light receiving sensors included in each pixel of the image sensor is also 2. The inventors of the present application have found that the noise generated in the image in which the crosstalk is removed can be reduced by setting the number (m) of light receiving sensors included in each pixel to be larger than the number (n) of optical systems. Thus, in the present aspect, the number (m) of light receiving sensors included in each pixel of the image sensor is larger than the number (n) of optical systems. Accordingly, it is possible to reduce noise generated in an image in which crosstalk is removed.

The "crosstalk ratio" is a ratio between light rays received from the optical systems. For example, it is assumed that three optical systems are included in the imaging lens. It is assumed that the three optical systems are a first optical system, a second optical system, and a third optical system. It is assumed that the crosstalk ratios in the light receiving sensors are first optical system:second optical system:third optical system=0.8:0.1:0.1. In this case, in a case where all the light reception amounts are 1, light rays are received by the light receiving sensors at a ratio of 0.8 from the first optical system, at a ratio of 0.1 from the second optical system, and at a ratio of 0.1 from the third optical system. That is, 80% of light rays received by the light receiving sensors are light rays from the first optical system, 10% of light rays are light rays from the second optical system, and 10% of light rays are light rays from third optical system.

The "crosstalk ratios are different" means that the ratios between light rays received from the optical systems are different. Accordingly, the light receiving sensors of which the crosstalk ratios are different are the light receiving sensors of which the ratios between the light rays received from the optical systems are different.

The "crosstalk removal processing" is processing for removing the influence of the crosstalk from the image. In a case where the crosstalk is caused, the image on which the image of another optical system is superimposed is captured. The image of another optical system is separated and removed through the crosstalk removal processing.

The "imaging characteristics" means characteristics related to the imaging, and the "optical systems of which imaging characteristics are different" are optical systems of which the characteristics related to the imaging are different. For example, there are optical systems of which focal lengths are different, optical systems of which focusing distances are different, and optical systems of which transmission wavelength characteristics are different.

(2) In the imaging device according to (1), in a case where pixel values of the primary image data items are A1, A2, ..., and Am, pixel values of the secondary image data items are B1, B2, . . . , and Bn, and the crosstalk ratios are C1=C11:C12: . . . :C1n, C2=C21:C22: . . . :C2n, . . . , and Cm=Cm1:Cm2: . . . :Cmn, the secondary image data generation unit generates the secondary image data items by solving the following simultaneous equations A1=C11*B1+ C12*B2+ . . . +C1n*Bn, A2=C21*B1+C22*B2+ . . . +C2n*Bn, . . . , and Am=Cm1*B1+Cm2*B2+ . . . +Cmn*Bn, as the crosstalk removal processing.

According to the present aspect, the secondary image data generation unit generates the secondary image data items by solving the following simultaneous equations A1=C11*B1+ C12*B2+ . . . +C1n*Bn, A2=C21*B1+C22*B2+ . . . +C2n*Bn, . . . , and Am=Cm1*B1+Cm2*B2+ . . . +Cmn*Bn, as the crosstalk removing processing. Accordingly, it is possible to reduce noise generated in an image in which crosstalk is removed.

(3) In the imaging device according to (1), in a case where a matrix of m rows×1 column in which pixel values A1, A2, . . . , and Am of the primary image data items are elements is A, a matrix of n rows×1 column in which pixel values B1, B2, . . . , and Bn of the secondary image data items are elements is B, a matrix of m rows×n columns in which the crosstalk ratios C1=C11:C12: . . . :C1n, C2=C21: C22: . . . :C2n, . . . , and Cm=Cm1:Cm2: . . . :Cmn are elements is C, and an inverse matrix of the C is $C^{-1}$, the secondary image data generation unit generates the secondary image data items by solving the following matrix equation $B=C^{-1}*A$, as the crosstalk removal processing.

According to the present aspect, the secondary image data generation unit generates the secondary image data items by solving the following matrix equation $B=C^{-1}*A$ as the crosstalk removal processing. Accordingly, it is possible to reduce noise generated in an image in which crosstalk is removed. In a case where a matrix C is not regular, a general inverse matrix of the matrix C is calculated, and an inverse matrix $C^{-1}$ is obtained. For example, the general inverse matrix can be calculated by a known method such as a Moore-Penrose inverse matrix.

(4) The imaging device according to (3) further comprises an inverse matrix information storage unit that stores information of the inverse matrix $C^{-1}$. The secondary image data generation unit solves the matrix equation by using the information of the inverse matrix $C^{-1}$ stored in the inverse matrix information storage unit.

According to the present aspect, the inverse matrix $C^{-1}$ required in the calculation is calculated in advance. Accordingly, it is possible to increase a processing speed of the crosstalk removal.

(5) In the imaging device according to (4), the inverse matrix information storage unit stores the information of the inverse matrix $C^{-1}$ for each pixel.

According to the present aspect, the inverse matrix $C^{-1}$ is calculated for each pixel. Accordingly, it is possible to remove the crosstalk with high accuracy.

(6) The imaging device according to any one of (1) to (5) further comprises an imaging scene information obtaining unit that obtains information of an imaging scene. The secondary image data generation unit changes the number of primary image data items to be used in the generation of the secondary image data items depending on the imaging scene.

According to the present aspect, the number of primary image data items to be used in the generation of the secondary image data items is changed depending on the imaging scene. For example, the number of primary image data items to be used in the generation of the secondary image data items is increased on an imaging scene in which noise concerned. Meanwhile, the number of primary image data items to be used in the generation of the secondary image data items is decreased on the imaging scene in which noise is not considered. Accordingly, it is possible to appropriately process the image data items depending on the imaging scene. The number of primary image data items to be used in the generation of the secondary image data items is increased on an imaging scene in which noise concerned, and thus, it is possible to further suppress noise. Meanwhile, the number of primary image data items to be used in the generation of the secondary image data items is decreased on the imaging scene in which noise is not considered, and thus, it is possible to increase a processing speed.

(7) In the imaging device according to (6), the imaging scene information obtaining unit specifies the imaging scene by analyzing the primary image data items.

According to the present aspect, the imaging scene is specified by analyzing the primary image data items. Accordingly, it is possible to automatically specify the imaging scene.

(8) In the imaging device according to any one of (1) to (7), the light receiving sensor includes a photoelectric conversion element, a microlens that forms an image of an emission pupil of the imaging lens on the photoelectric conversion element, and a light shielding mask that is disposed between the microlens and the light receiving sensor. A difference in shape of the light shielding mask and/or image forming characteristics of the microlens causes a difference in the crosstalk ratios.

According to the present aspect, each of the light receiving sensors included in each pixel includes the photoelectric conversion element, the microlens, and the light shielding mask. In each light receiving sensor, the crosstalk ratios are changed due to a change in shape of the light shielding mask and/or image forming characteristics of the microlens. Here, the "image forming characteristics" are characteristics related to image forming, and the "image forming characteristics of the microlens are different" means that characteristics related to image forming of the microlens are different. For example, these characteristics mean that a lens power, a magnification, and an image forming position of the microlens are different.

(9) In the imaging device according to any one of (1) to (7), the light receiving sensor includes a photoelectric conversion element, and a microlens that forms an image of an emission pupil of the imaging lens on the photoelectric conversion element. A difference in image forming characteristics of the microlens causes a difference in the crosstalk ratios.

According to the present aspect, each of the light receiving sensors included in each pixel includes the photoelectric conversion element, and the microlens. In each light receiving sensor, the crosstalk ratios are changed due to a change in image forming characteristics of the microlens.

(10) In the imaging device according to any one of (1) to (9), the n number of optical systems included in the imaging lens have different focal lengths.

According to the present aspect, the optical systems included in the imaging lens are optical systems of which focal lengths are different. Accordingly, for example, images of which focal lengths are different, such as a telephoto image and a wide-angle image, can be captured.

(11) In the imaging device according to any one of (1) to (9), the n number of optical systems included in the imaging lens have different focusing distances.

According to the present aspect, the optical system included in the imaging lens are optical systems of which focusing distances are different. Accordingly, images of which focusing distances are different, such as an image focused on a subject present in a short range and an image focused on a subject present in a long range, can be captured.

(12) In the imaging device according to any one of (1) to (9), the n number of optical systems included in the imaging lens have different transmission wavelength characteristics.

According to the present aspect, the optical systems included in the imaging lens are optical systems of which transmission wavelength characteristics are different. The "transmission wavelength characteristics" are characteristics that transmit light rays having a specific wavelength range, and the "optical systems of which transmission wavelength characteristics are different" are optical systems of which characteristics that transmit light rays having a specific wavelength range are different. For example, in a case where the imaging lens includes two optical systems, one optical system is an optical system that transmits light rays having an infrared light range, and the other optical system is an optical system that transmits light rays having a visible light range.

(13) In the imaging device according to any one of (10) to (12), the n number of optical systems included in the imaging lens are concentrically disposed.

(14) There is provided an image data generation method using an imaging device which includes an imaging lens including n number of optical systems of which imaging characteristics are different in which n is an integer satisfying n>1 and an image sensor including m number of light receiving sensors of which crosstalk ratios are different in each pixel in which m is an integer satisfying m>n. The method comprises a step of exposing the image sensor, a step of obtaining image signals from the light receiving sensors of each pixel of the image sensor and generating m number of primary image data items, and a step of generating n number of secondary image data items corresponding to the optical systems by performing crosstalk removal processing on the m number of primary image data items for each pixel.

In the present aspect, the number (m) of light receiving sensors included in each pixel of the image sensor is larger than the number (n) of optical systems included in the imaging lens. Accordingly, it is possible to reduce noise generated in an image in which crosstalk is removed.

(15) In the image data generation method using the imaging device according to (14), in a case where pixel values of the primary image data items are A1, A2, . . . , and Am, pixel values of the secondary image data items are B1, B2, . . . , and Bn, and the crosstalk ratios are C1=C11:C12: . . . :C1n, C2=C21:C22: . . . :C2n, . . . , and Cm=Cm1:Cm2: . . . :Cmn, the secondary image data items are generated by solving the following simultaneous equations A1=C11*B1+C12*B2+ . . . +C1n*Bn, A2=C21*B1+C22*B2+ . . . +C2n*Bn, . . . , and Am=Cm1*B1+Cm2*B2+ . . . +Cmn*Bn, as the crosstalk removal processing.

In the present aspect, the secondary image data items are generated by performing the processing for solving the following simultaneous equations A1=C11*B1+C12*B2+ . . . +C1n*Bn, A2=C21*B1+C22*B2+ . . . +C2n*Bn, . . . , and Am=Cm1*B1+Cm2*B2+ . . . +Cmn*Bn, as the crosstalk removal processing. Accordingly, it is possible to reduce noise generated in an image in which crosstalk is removed.

(16) In the image data generation method using the imaging device according to (14), in a case where a matrix of m rows×1 column in which pixel values A1, A2, . . . , and Am of the primary image data items are elements is A, a matrix of n rows×1 column in which pixel values B1, B2, . . . , and Bn of the secondary image data items are elements is B, a matrix of m rows×n columns in which the crosstalk ratios C1=C11:C12: . . . :C1n, C2=C21:C22: . . . :C2n, . . . , and Cm=Cm1:Cm2: . . . :Cmn are elements is C, and an inverse matrix of the C is $C^{-1}$, the secondary image data items are generated by solving the following matrix equation $B=C^{-1}*A$, as the crosstalk removal processing.

In the present aspect, the secondary image data items are generated by performing processing for solving the following matrix equation $B=C^{-1}*A$ as the crosstalk removal processing. Accordingly, it is possible to reduce noise generated in an image in which crosstalk is removed. In a case where a matrix C is not regular, a general inverse matrix of the matrix C is calculated, and an inverse matrix $C^{-1}$ is obtained.

According to the present aspect, the imaging lens is constituted such that a plurality of optical systems is concentrically disposed.

According to the present invention, it is possible to reduce noise generated in an image in which crosstalk is removed.

BRIEF DESCRIPTION OF THE DRAWINGS

FIG. 23 is a conceptual diagram showing the relationship between the primary image data items and the secondary image data items.

DESCRIPTION OF THE PREFERRED EMBODIMENTS

Hereinafter, preferred embodiment of the present invention will be described in detail with reference to the accompanying drawings.

First Embodiment

<<Device Configuration of Imaging Device>>

Figure 1:
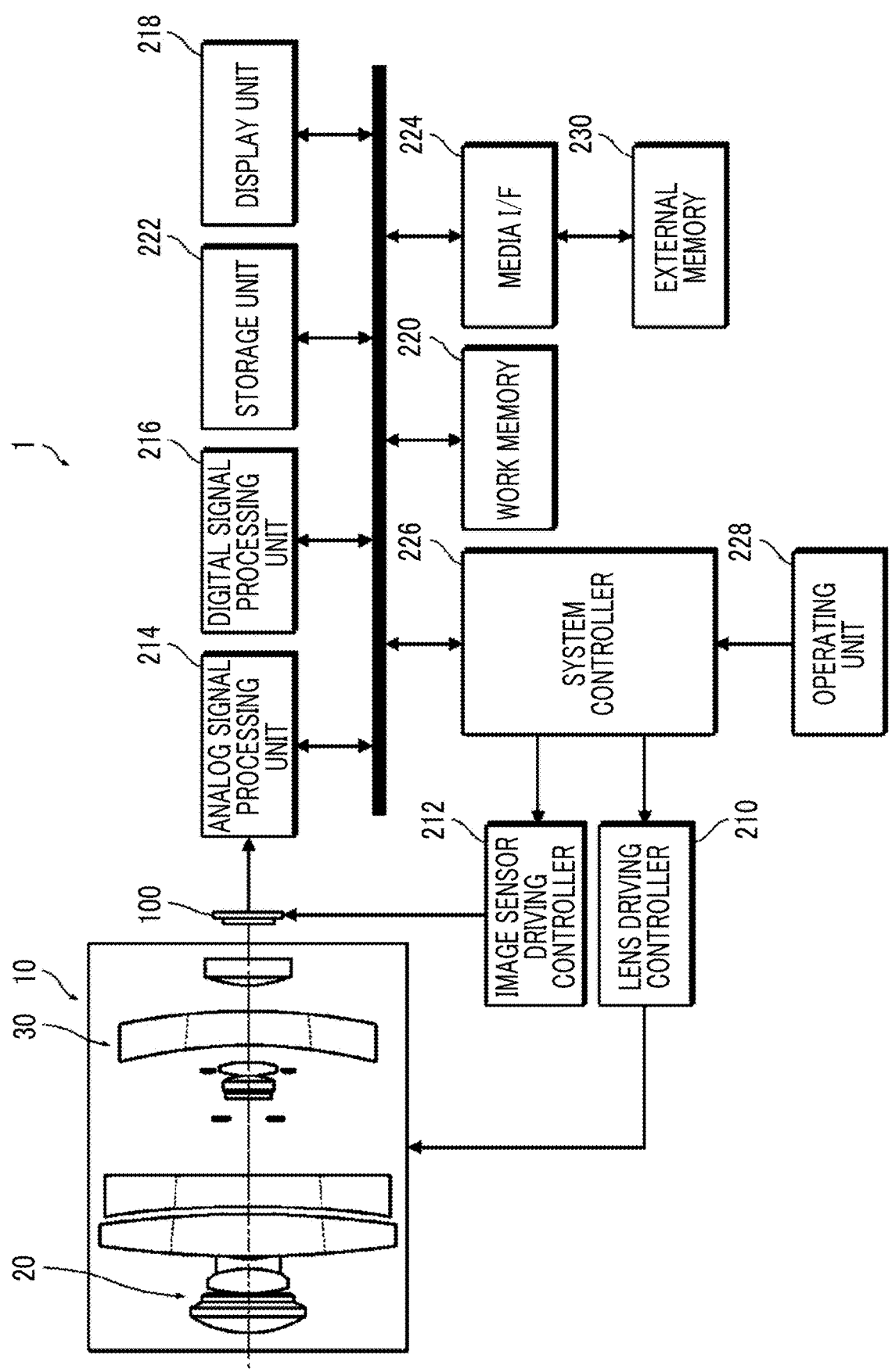
FIG. 1 is a block diagram showing a system configuration of an imaging device.

FIG. 1 is a block diagram showing a system configuration of an imaging device.

An imaging device 1 mainly includes an imaging lens 10, an image sensor 100, a lens driving controller 210, an image sensor driving controller 212, an analog signal processing unit 214, a digital signal processing unit 216, a display unit 218, a work memory 220, a storage unit 222, a media interface 224, a system controller 226, and an operating unit 228.

<Imaging Lens>

Figure 2:
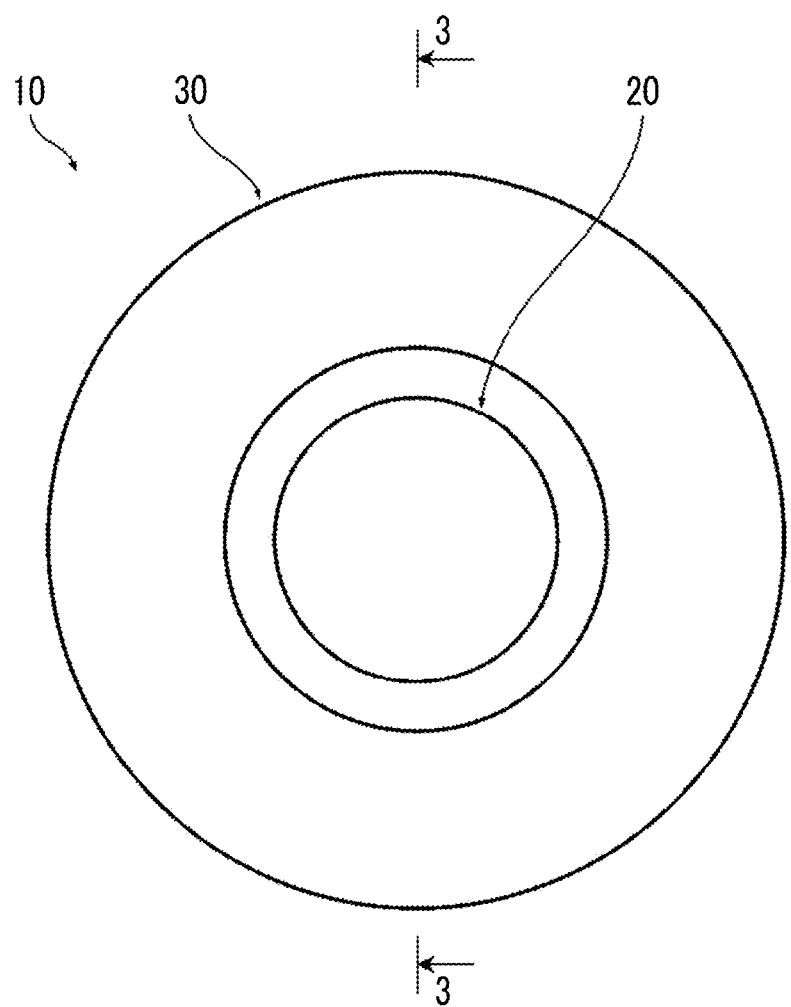
FIG. 2 is a front view showing a schematic configuration of an imaging lens.
Figure 3:
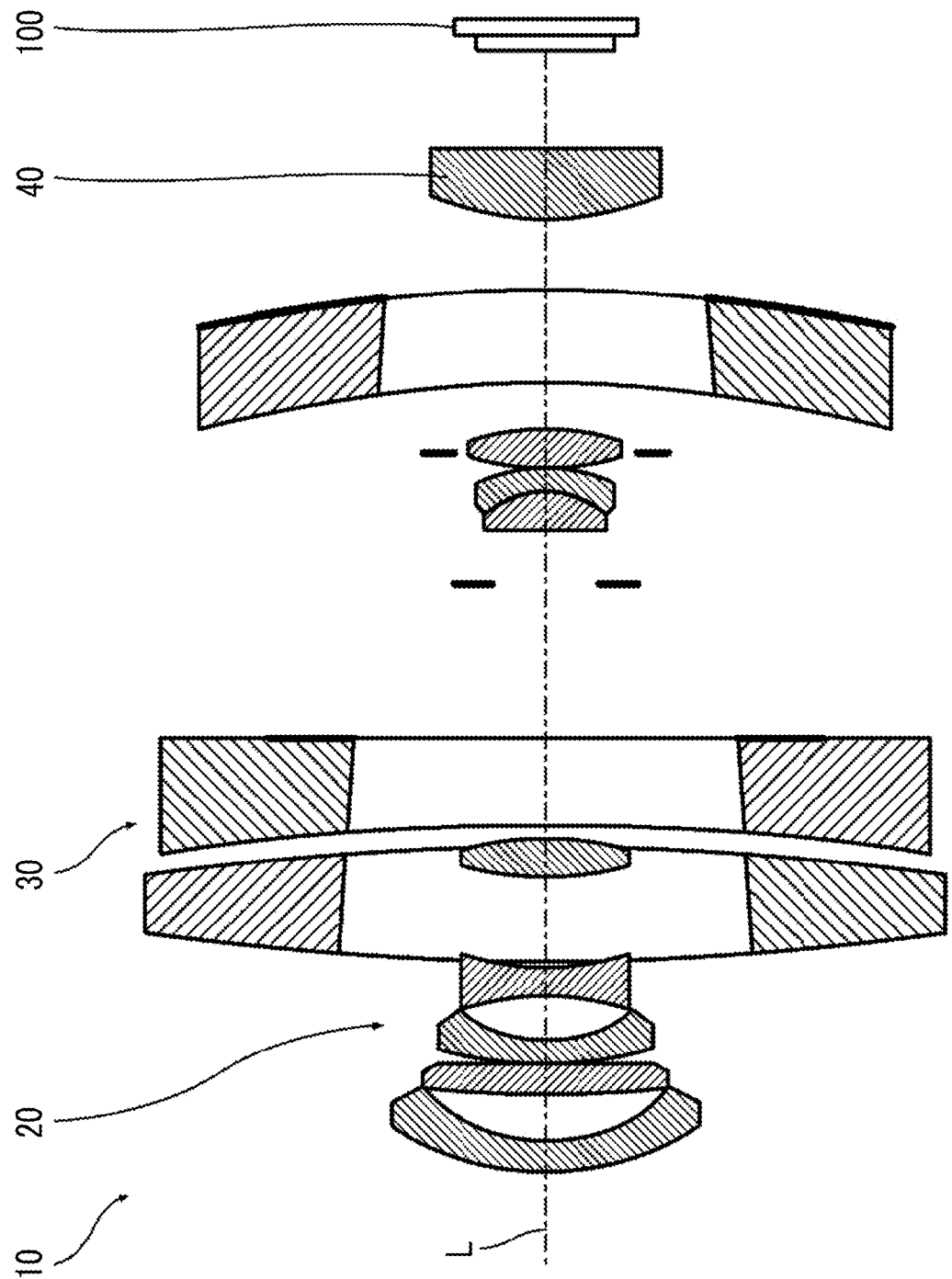
FIG. 3 is a cross-sectional view taken along line 3-3 of FIG. 2.

FIG. 2 is a front view showing a schematic configuration of the imaging lens. FIG. 3 is a cross-sectional view taken along 3-3 of FIG. 2.

The imaging lens 10 includes two optical systems 20 and 30. The two optical systems 20 and 30 are concentrically disposed. Accordingly, the optical systems 20 and 30 have the same optical axis L. Hereinafter, the central optical system 20 is referred to as a first optical system, and the outer optical system 30 is referred to as a second optical system. These optical systems are distinguished from each other if necessary.

The first optical system 20 and the second optical system 30 are optical systems of which focal lengths are different. The first optical system 20 is a wide-angle optical system, and the second optical system 30 is a telephoto optical system. Here, the wide-angle optical system is an optical system of which a focal length is shorter than that of a standard optical system (an optical system having an angle of view of about 50°). The telephoto optical system is an optical system of which a focal length is longer than that of the standard optical system.

[First Optical System]

Figure 4:
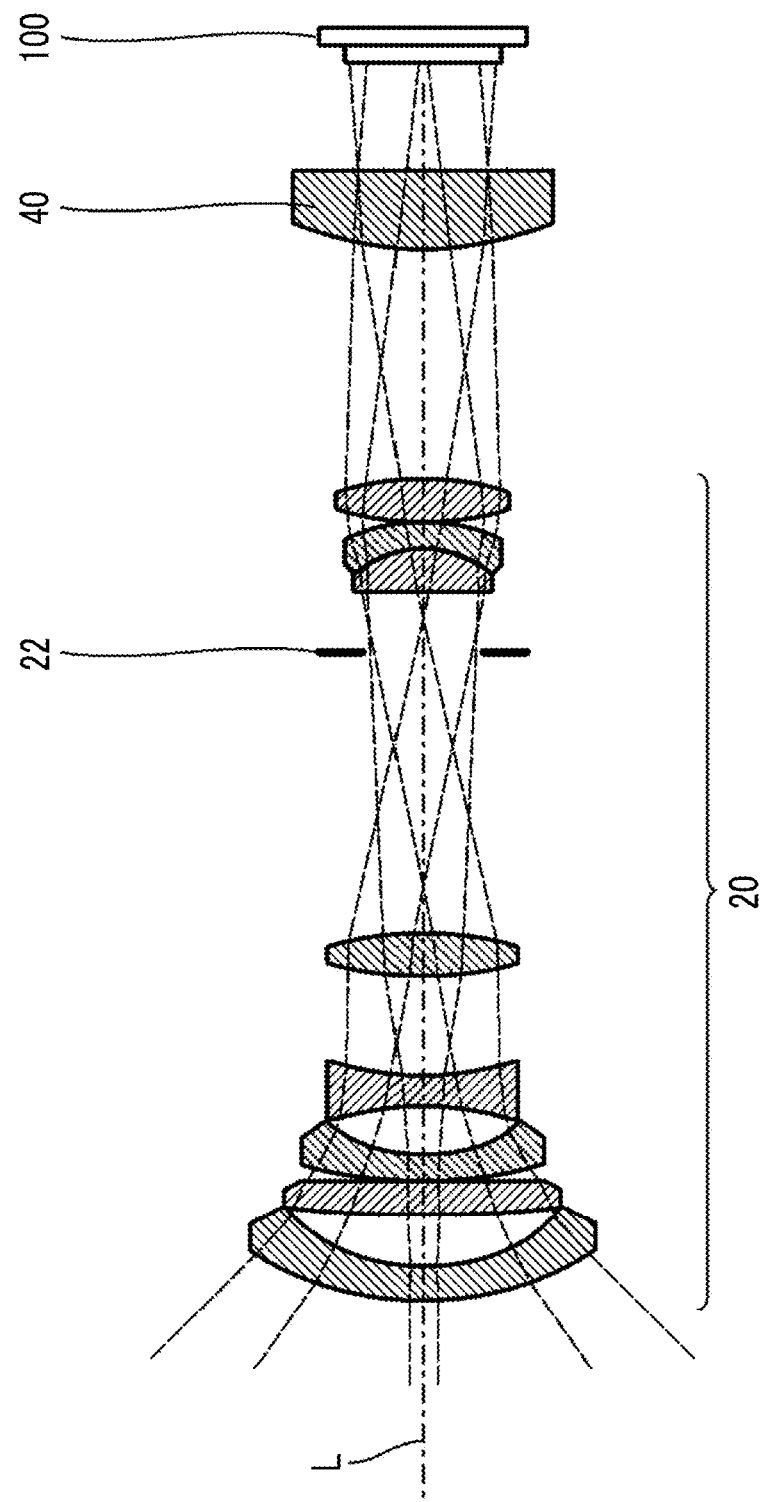
FIG. 4 is a cross-sectional view showing a schematic configuration of a first optical system.

FIG. 4 is a cross-sectional view showing a schematic configuration of the first optical system. In this drawing, dashed lines depict light ray traces of light rays passing through the first optical system 20.

As shown in FIG. 4, the first optical system 20 is composed of three groups, and is composed of eight lenses. The first optical system 20 has a stop 22 between a second lens group and a third lens group. The stop 22 has an annular light shielding portion. The stop 22 adjusts a light amount of light rays passing through the first optical system 20 by expanding or contracting an inner diameter of the annular light shielding portion.

[Second Optical System]

Figure 5:
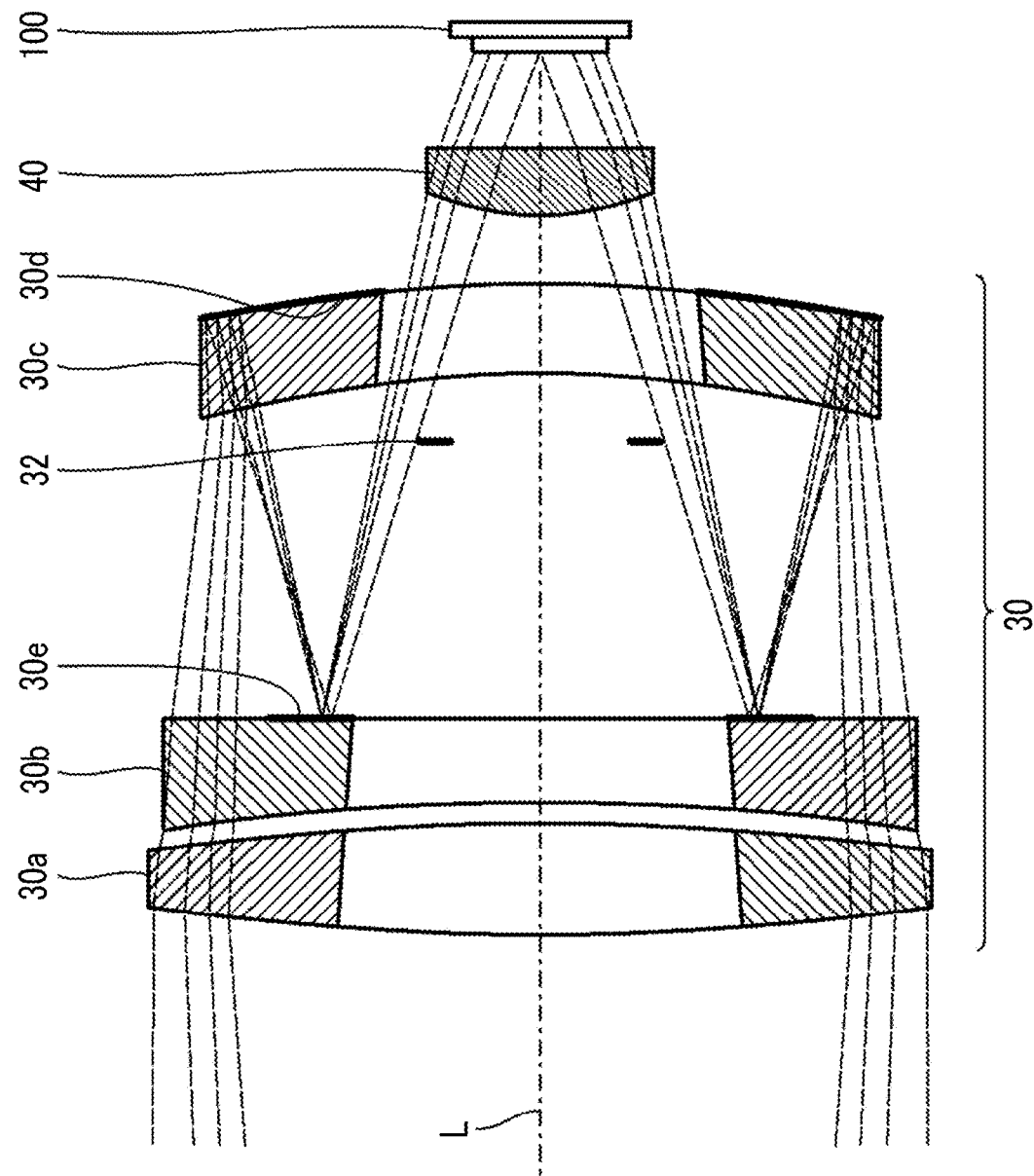
FIG. 5 is a cross-sectional view showing a schematic configuration of a second optical system.

FIG. 5 is a cross-sectional view showing a schematic configuration of the second optical system. In this drawing, dashed lines depict light ray traces of light rays passing through the second optical system 30.

As shown in FIG. 5, the second optical system 30 is a so-called reflective optical system. The second optical system 30 includes a first lens 30a, a second lens 30b, a third lens 30c, a main mirror 30d, and a secondary mirror 30e. Since the second optical system 30 is disposed outside the first optical system 20, the components thereof have annular shapes.

The first lens 30a, the second lens 30b, and the third lens 30c are disposed along the optical axis L in order of the first lens 30a, the second lens 30b, and the third lens 30c from an object.

The main mirror 30d is provided on a surface of an image surface of the third lens 30c. A reflective film is formed on the surface of the image surface of the third lens 30c, and thus, the main mirror 30d is integrally provided on the third lens 30c. The main mirror 30d is provided on the entire surface of the image of the image surface of the third lens 30c.

The secondary mirror 30e is provided on a surface of an image surface of the second lens 30b. A reflective film is formed on the surface of the image surface of the second lens 30b, and thus, the secondary mirror 30e is integrally provided on the second lens 30b. The secondary mirror 30e is provided an inner peripheral portion of the surface of the image surface of the second lens 30b.

Light rays incident on the second optical system 30 pass through the first lens 30a, the second lens 30b, and the third lens 30c, and are incident on the main mirror 30d. The light rays incident on the main mirror 30d are reflected from the main mirror 30d, pass through the third lens 30c again, and are incident on the secondary mirror 30e. The light rays incident on the secondary mirror 30*e* are reflected from the secondary mirror 30*e*, and are emitted.

The second optical system 30 has a stop 32 in a latter stage of the secondary mirror 30*e*. The stop 32 has an annular light shielding portion. The stop 32 adjusts a light amount of light rays passing through the second optical system 30 by expanding or contracting an outer diameter of the annular light shielding portion.

[Common Lens]

The imaging lens 10 has a common lens 40 common to the first optical system 20 and the second optical system 30. The light rays passed through the first optical system 20 and the second optical system 30 are incident on the image sensor 100 through the common lens 40. The common lens 40 has a function of adjusting an incidence angle of the light rays incident on the image sensor 100 through the first optical system 20 and the second optical system 30.

[Focus Adjustment Mechanism]

Foci of the first optical system 20 and the second optical system 30 are independently adjusted. The entire optical system is moved forward and backward along the optical axis L, and thus, the focus of the first optical system 20 is adjusted. Similarly, the entire optical system is moved forward and backward along the optical axis L, and thus, the focus of the second optical system 30 is adjusted. Although not shown, the imaging lens 10 includes a mechanism (focus adjustment mechanism) for moving the first optical system 20 forward and backward along the optical axis L and a mechanism (focus adjustment mechanism) for moving the second optical system 30 forward and backward along the optical axis L.

<Image Sensor>

Figure 6:
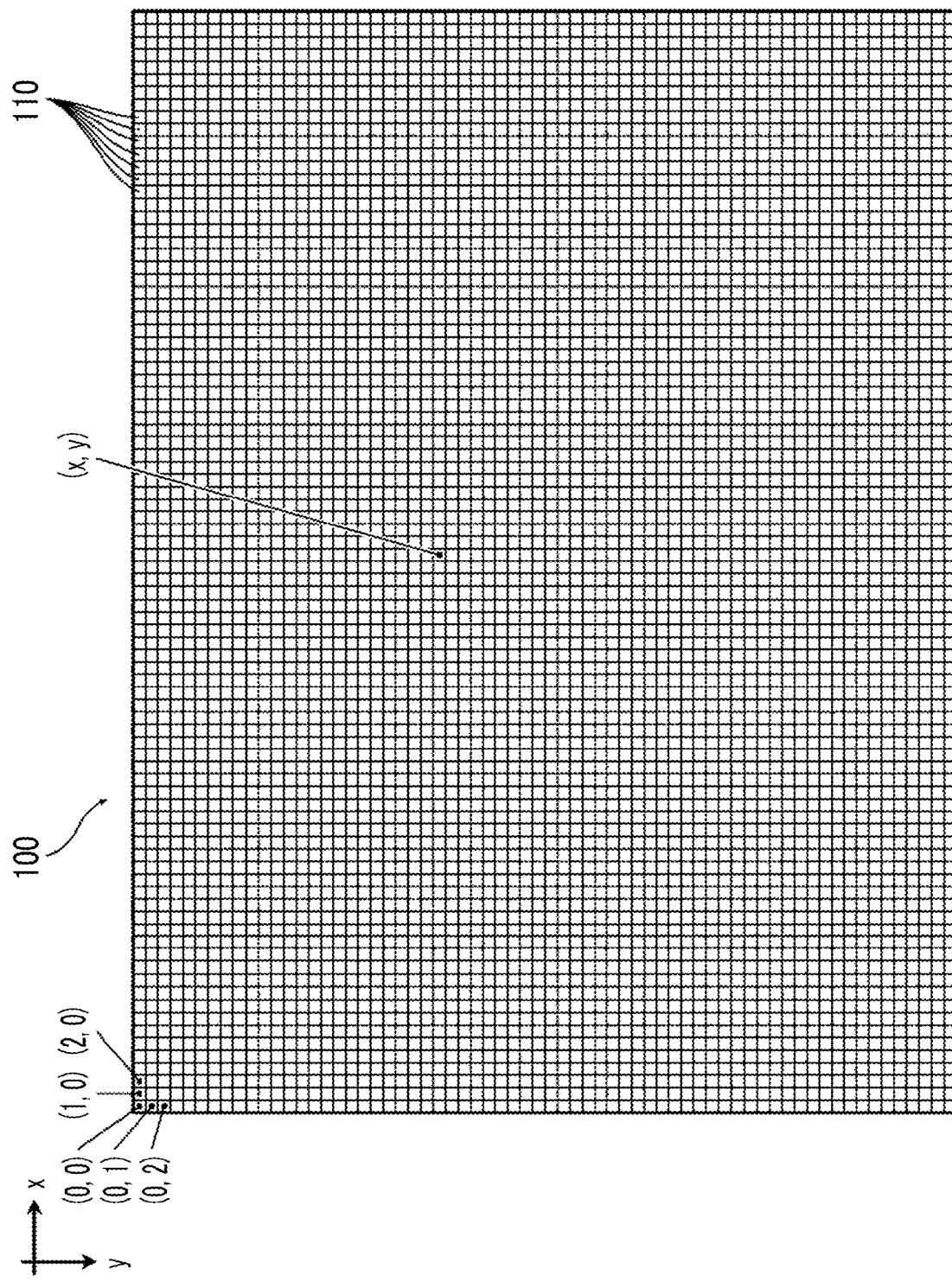
FIG. 6 is a front view of a light reception surface of an image sensor.

FIG. 6 is a front view of a light reception surface of the image sensor.

The image sensor 100 includes a plurality of pixels 110 on the light reception surface. The plurality of pixels 110 is arrayed on the light reception surface in a two-dimensional matrix shape.

Figure 7:
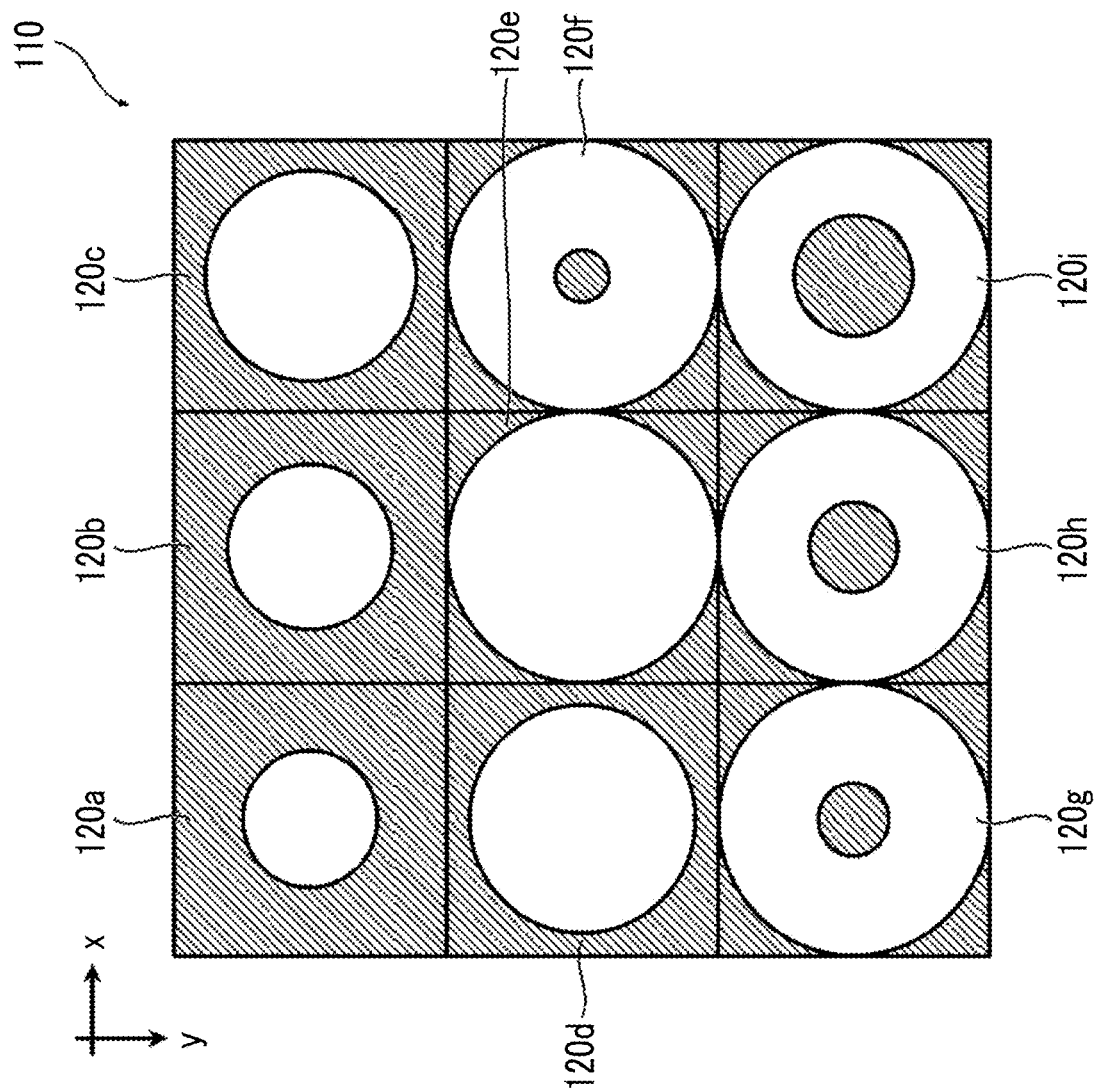
FIG. 7 is an enlarged front view showing one pixel of the image sensor.

FIG. 7 is an enlarged front view of one pixel of the image sensor. In this drawing, diagonal lines depict mask regions using a light shielding mask. The light shielding mask will be described below.

The image sensor 100 includes a plurality of light receiving sensors in one pixel 110. The plurality of light receiving sensors is disposed in a two-dimensional matrix shape. The image sensor 100 of the present embodiment includes nine light receiving sensors 120*a* to 120*i* in one pixel 110, as shown in FIG. 7. The nine light receiving sensors 120*a* to 120*i* are disposed in a two-dimensional matrix shape in an array of 3 rows×3 columns (3×3). Hereinafter, the light receiving sensor assigned a reference 120*a* is referred to as a first light receiving sensor, the light receiving sensor assigned a reference 120*b* is referred to as a second light receiving sensor, the light receiving sensor assigned a reference 120*c* is referred to as a third light receiving sensor, the light receiving sensor assigned a reference 120*d* is referred to as a fourth light receiving sensor, the light receiving sensor assigned a reference 120*e* is referred to as a fifth light receiving sensor, the light receiving sensor assigned a reference 120*f* is referred to as a sixth light receiving sensor, the light receiving sensor assigned a reference 120*g* is referred to as a seventh light receiving sensor, the light receiving sensor assigned a reference 120*h* is referred to as an eighth light receiving sensor, and the light receiving sensor assigned a reference 120*i* is referred to as a ninth light receiving sensor. These light receiving sensors are distinguished from one another if necessary.

The nine light receiving sensors 120*a* to 120*i* have different crosstalk ratios from one another. The "nine light receiving sensors have different crosstalk ratios from one another" means that light rays are received from optical systems at different ratios. That is, the light receiving sensors 120*a* to 120*i* receive light rays from the first optical system 20 and the second optical system 30 at different ratios.

Figure 8:
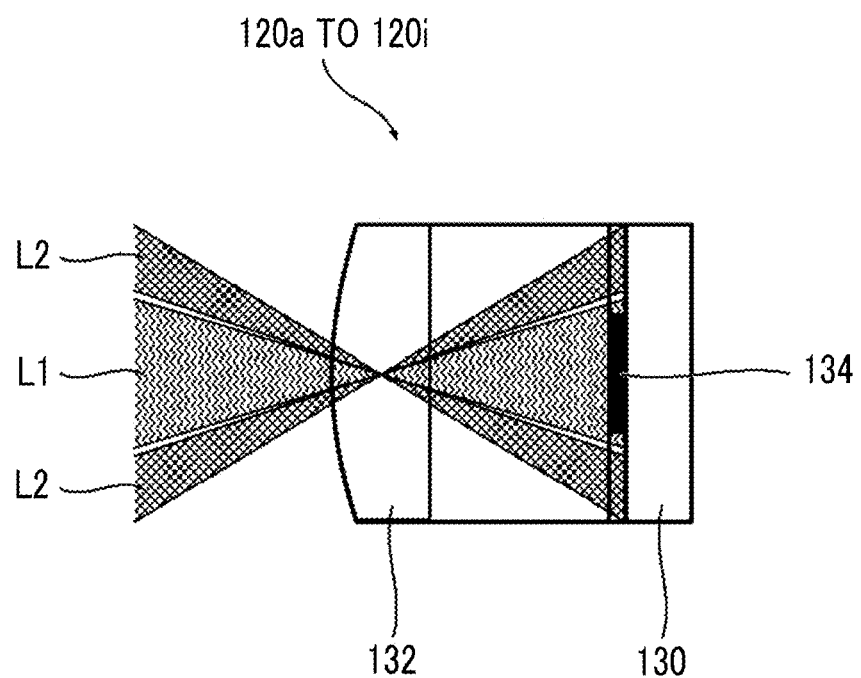
FIG. 8 is a cross-sectional view showing a schematic configuration of a light receiving sensor.

FIG. 8 is a cross-sectional view showing a schematic configuration of the light receiving sensor. In this drawing, a region L1 depicted by wavy lines conceptually represents light rays incident from the first optical system 20, and a region L2 depicted by an oblique lattice conceptually represents light rays incident from the second optical system 30.

Basic configurations of the light receiving sensors 120*a* to 120*i* are the same. Each of the light receiving sensors 120*a* to 120*i* includes a photoelectric conversion element 130, a microlens 132, and a light shielding mask 134.

The photoelectric conversion element 130 receives light, and accumulates electric charges in proportion to intensity of the received light. The photoelectric conversion element 130 is, for example, a photodiode.

The microlens 132 forms images of emission pupils of the first optical system 20 and the second optical system 30 on the photoelectric conversion element 130.

The light shielding mask 134 is disposed between the microlens 132 and the photoelectric conversion element 130. The light shielding mask 134 blocks a part of the light rays passed through the microlens 132.

The crosstalk ratios of the light receiving sensors 120*a* to 120*i* are adjusted by adjusting the shape of the light shielding mask 134.

Figure 9:
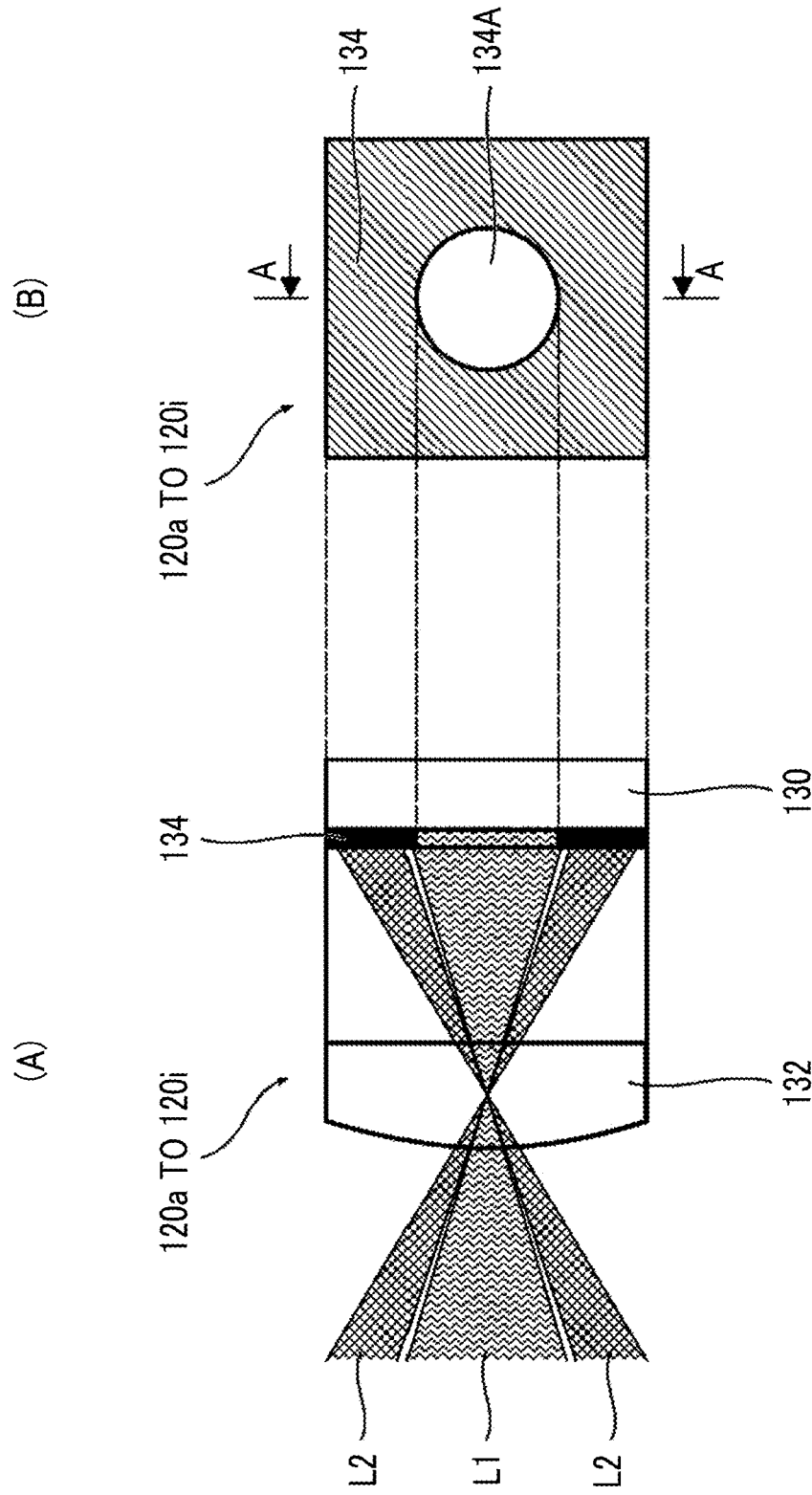
FIG. 9 is a diagram showing an example of the light receiving sensor.

FIG. 9 is a diagram showing an example of the light receiving sensor. (A) in this drawing is a cross-sectional view (cross-sectional view taken along line A-A in (B) in this drawing) of the light receiving sensor, and (B) in this drawing is a front view of the light receiving sensor. In (B) in this drawing, a region depicted by diagonal lines represents a light shielding region of the light shielding mask 134.

FIG. 9 shows an example in a case where light rays from the first optical system 20 are mainly received. In this case, the light shielding mask 134 has a shape including a circular opening portion 134A in the center as shown in FIG. 9(B). In each of the light receiving sensors 120*a* to 120*i* of the present example, since the light rays from the second optical system 30 are blocked by the light shielding mask 134 as shown in FIG. 9(A), the light rays from the first optical system 20 are mainly received by the photoelectric conversion element 130.

Figure 10:
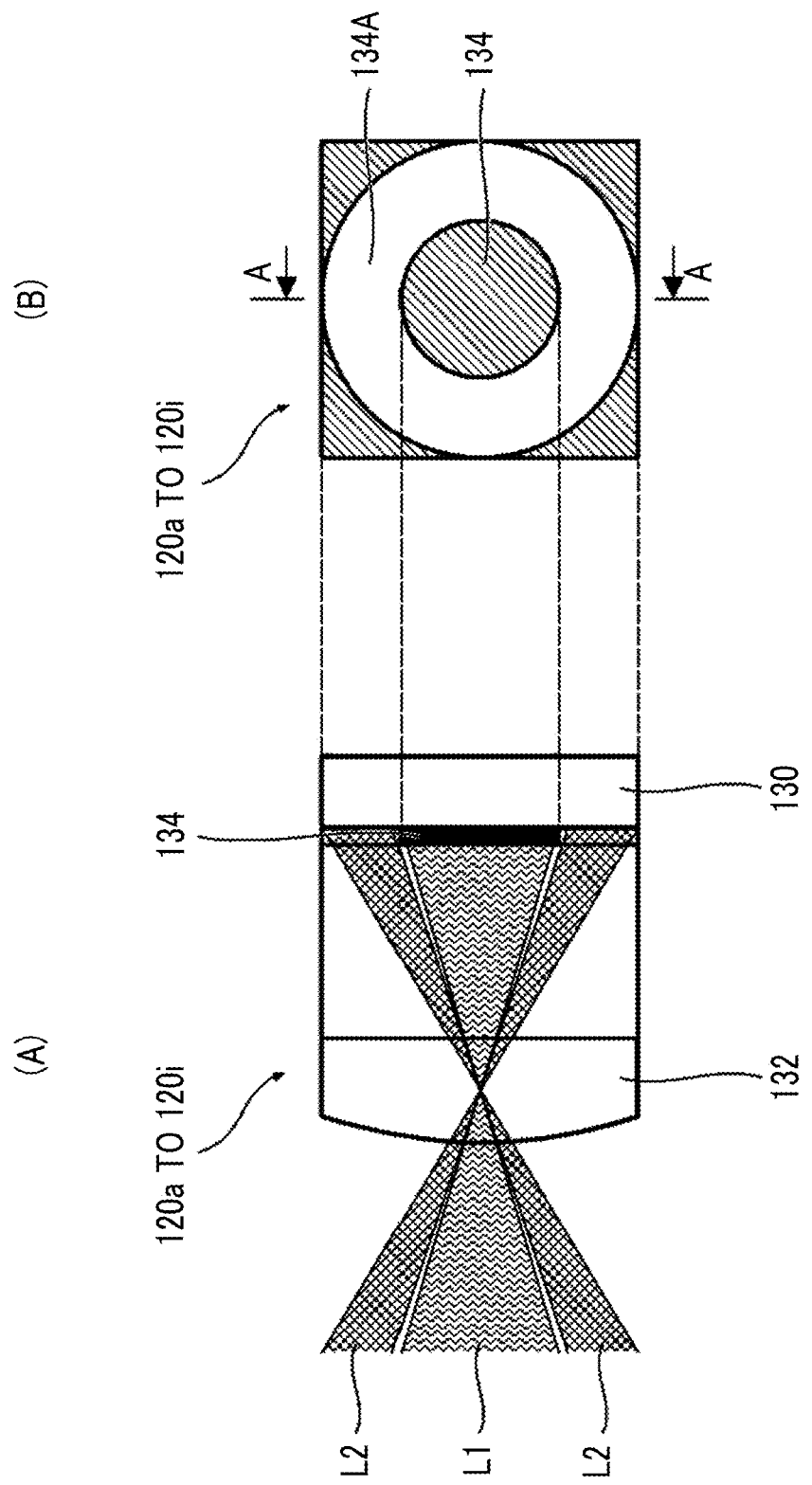
FIG. 10 is a diagram showing an example of the light receiving sensor.

FIG. 10 is a diagram showing an example of the light receiving sensor. (A) in this drawing is a cross-sectional view (cross-sectional view taken along line A-A in (B) in this drawing) of the light receiving sensor, and (B) in this drawing is a front view of the light receiving sensor. In (B) in this drawing, a region depicted by diagonal lines represents a light shielding region of the light shielding mask 134.

FIG. 10 shows an example in a case where light rays from the second optical system 30 are mainly received. In this case, the light shielding mask 134 has a shape including an annular opening portion 134A as shown in FIG. 10(B). In each of the light receiving sensors 120*a* to 120*i* of the present example, since light rays from the first optical system 20 are blocked by the light shielding mask 134 as shown in FIG. 10(A), the light rays from the second optical system 30 are mainly received by the photoelectric conversion element 130.

As stated above, the crosstalk ratios of the light receiving sensors 120a to 120i can be adjusted by adjusting the shape of the light shielding mask 134.

The image sensor 100 reads out electric charge amounts accumulated in the photoelectric conversion elements 130 of the light receiving sensors 120a to 120i of each pixel 110, and outputs signals corresponding to the electric charge amounts, as image signals. Image data items corresponding to the optical systems can be obtained by processing the image signals. The processing will be described in detail below.

<Lens Driving Controller>

The lens driving controller 210 controls the driving of the imaging lens 10 based on a command from the system controller 226. That is, the driving of the focus adjustment mechanism of the first optical system 20 is controlled in order to adjust the focus of the first optical system 20, and the driving of the focus adjustment mechanism of the second optical system 30 is controlled in order to adjust the focus of the second optical system 30. The driving of the stop 22 of the first optical system 20 is controlled in order to adjust the light amount of the first optical system 20, and the driving of the stop 32 of the second optical system 30 is controlled in order to adjust the light amount of the second optical system 30.

<Image Sensor Driving Controller>

The image sensor driving controller 212 controls the driving of the image sensor 100 based on a command from the system controller 226. That is, the image sensor driving controller controls the reading of the image signals from the image sensor 100.

<Analog Signal Processing Unit>

The analog signal processing unit 214 takes analog image signals output from the image sensor 100, and performs predetermined analog signal processing. The analog signal processing unit 214 converts the image signals obtained through the predetermined analog signal processing into digital signals, and outputs the digital signals.

<Digital Signal Processing Unit>

The digital signal processing unit 216 takes the image signals converted into the digital signals, performs predetermined signal processing, and generates the image data items corresponding to the optical systems. The processing will be described in detail below.

<Display Unit>

For example, the display unit 218 is a liquid crystal monitor, and displays a captured image or an image being captured (so-called live view image). The display unit 218 functions as a graphical user interface (GUI) if necessary.

<Work Memory>

For example, the work memory 220 is a random access memory (RAM), and functions as a work memory.

<Storage Unit>

For example, the storage unit 222 is a non-volatile memory such as electrically erasable programmable read-only memory (EEPROM). The storage unit 222 stores data required in the controlling or data required in the signal processing.

<Media Interface>

The media interface 224 reads or writes data from and to an external memory 230 such as a memory card based on a command from the system controller 226.

<System Controller>

The system controller 226 controls an operation of the entire imaging device. For example, the system controller 226 is a microcomputer including a central processing unit (CPU), a read only memory (ROM), and a RAM, and controls the entire imaging device 1 by executing a predetermined control program. Various data items and a program required in the controlling are stored in the ROM.

<Operating Unit>

The operating unit 228 includes various operating buttons such as a power button and a shutter button, and a driving circuit. Instructional information of the operating unit 228 is input to the system controller 226. The system controller 226 controls the units based on the instructional information from the operating unit 228.

The imaging device 1 has the above-described configuration.

<<Generation Process of Image Data Items Corresponding to Optical Systems>>

<Outline of Process>

As stated above, the image sensor 100 includes the nine light receiving sensors 120a to 120i in each pixel 110. Accordingly, the image signals of the light receiving sensors corresponding to each pixel are obtained, and thus, it is possible to generate nine image data items by performing imaging once. However, crosstalk is caused in the nine image data items. Thus, in the imaging device 1 of the present embodiment, the image data items corresponding to the optical systems are generated by performing crosstalk removal processing on the nine image data items obtained through the imaging. Hereinafter, the processing will be described.

Hereinafter, the nine image data items generated by obtaining the image signals of the corresponding light receiving sensors from each pixel of the image sensor 100 are referred to as primary image data items, and the image data items generated by performing the crosstalk removal processing on the nine primary image data items are referred to as secondary image data items. The primary and secondary image data items are distinguished from each other if necessary.

<Generation of Primary Image Data>

Figure 11:
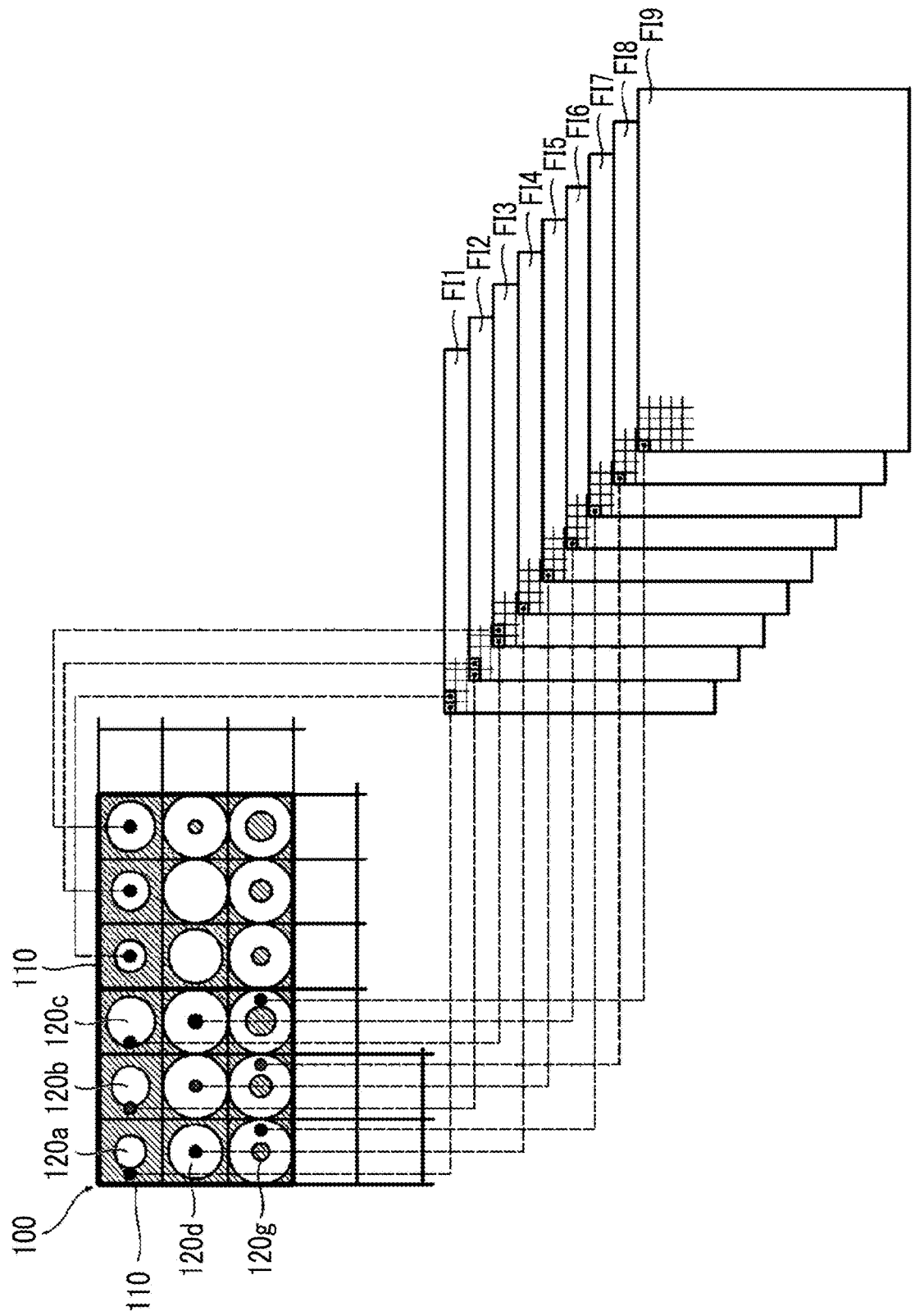
FIG. 11 is a conceptual diagram for describing the generation of nine primary image data items from outputs of the image sensor.

FIG. 11 is a conceptual diagram for describing the generation of the nine primary image data items from the outputs of the image sensor.

The primary image data items are generated by obtaining the image signals of the corresponding light receiving sensors 120a to 120i from each pixel 110 of the image sensor 100.

For example, the image signal of the first light receiving sensor 120a is obtained from each pixel 110 of the image sensor 100, and thus, the primary image data corresponding to the first light receiving sensor 120a is generated. Similarly, the image signal of the second light receiving sensor 120b is obtained from each pixel 110 of the image sensor 100, and thus, the primary image data corresponding to the second light receiving sensor 120b is generated.

Here, it is assumed that the primary image data generated from the image signal obtained from the first light receiving sensor 120a of each pixel 110 is referred to as first primary image data FI1, the primary image data generated from the image signal obtained from the second light receiving sensor 120b of each pixel 110 is referred to as second primary image data FI2, the primary image data generated from the image signal obtained from the third light receiving sensor 120c of each pixel 110 is referred to as third primary image data FI3, the primary image data generated from the image signal obtained from the fourth light receiving sensor 120d of each pixel 110 is referred to as fourth primary image data FI4, the primary image data generated from the image signal obtained from the fifth light receiving sensor 120e of each pixel 110 is referred to as fifth primary image data FI5, the primary image data generated from the image signal obtained from the sixth light receiving sensor 120f of each pixel 110 is referred to as sixth primary image data FI6, the primary image data generated from the image signal obtained from the seventh light receiving sensor 120g of each pixel 110 is referred to as seventh primary image data FI7, the primary image data generated from the image signal obtained from the eighth light receiving sensor 120h of each pixel 110 is referred to as eighth primary image data FI8, and the primary image data generated from the image signal obtained from the ninth light receiving sensor 120i of each pixel 110 is referred to as ninth primary image data FI9.

Figure 12:
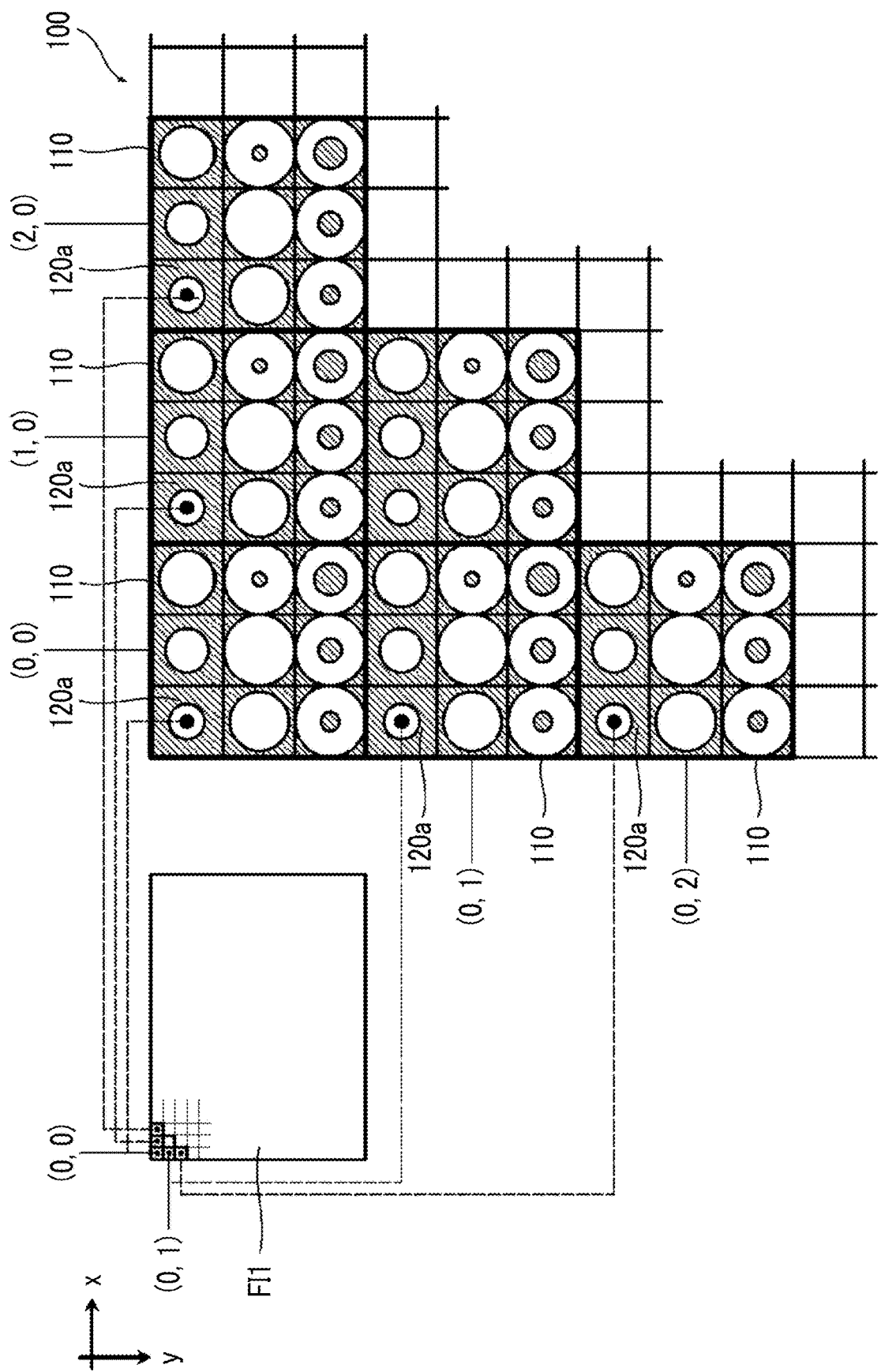
FIG. 12 is a conceptual diagram for describing the generation of the individual primary image data items from the outputs of the image sensor.

FIG. 12 is a conceptual diagram for describing the generation of the individual primary image data items from the outputs of the image sensor. Particularly, this drawing shows a case where the first primary image data FI1 is generated from the output of the image sensor.

As shown in FIG. 12, the first primary image data FI1 is generated by obtaining the image signal of the first light receiving sensor 120a from each pixel 110 of the image sensor 100. For example, a value (pixel value) in a pixel position (0, 0) of the first primary image data FI1 is generated by obtaining the image signal from the first light receiving sensor 120a in the pixel position (0, 0) of the image sensor 100. Similarly, a value (pixel value) in a pixel position (0, 1) of the first primary image data FI1 is generated by obtaining the image signal from the first light receiving sensor 120a in the pixel position (0, 1) of the image sensor 100. As stated above, a value (pixel value) of each pixel of the first primary image data FI1 is generated by obtaining the image signal from the first light receiving sensor 120a in the corresponding pixel 110 of the image sensor 100.

The pixel position (x, y) is obtained by expressing the position of the pixel as xy coordinates. The xy coordinates are set as follows. That is, in the image sensor 100, as shown in FIG. 6, an upper left corner of a screen is a coordinate origin, a horizontal direction is an x coordinate, and a vertical direction is a y coordinate. In this case, a position of a specific pixel is expressed as (x, y). The same is true for the image data. An upper left corner of a screen is a coordinate origin, a horizontal direction is an x coordinate, and a vertical direction is a y coordinate.

The same is true of other primary image data items. The other primary image data items are generated by obtaining the image signals of the corresponding light receiving sensors from the respective pixels 110 of the image sensor 100.

<Generation of Secondary Image Data>

The secondary image data items are generated by performing the crosstalk removal processing on the primary image data items for each pixel. Hereinafter, the crosstalk removal processing will be described.

[Basic Concept of Crosstalk Removal Processing]

Initially, a basic concept of the crosstalk removal processing will be described. Here, in order to facilitate the understanding of the invention, an example in which the number (n) of optical systems included in the imaging lens is two and the number (m) of light receiving sensors included in each pixel of the image sensor is two will be described.

It is assumed that one optical system is a first optical system and the other optical system is a telephoto second optical system as the two optical systems included in the imaging lens. It is assumed that the first optical system is a wide-angle optical system and the second optical system is a telephoto optical system.

It is assumed that one light receiving sensor is a first light receiving sensor and the other light receiving sensor is a second light receiving sensor as the two light receiving sensors included in each pixel. It is assumed that all the first light receiving sensors included in the pixels have the same crosstalk ratios. Similarly, it is assumed that all the second light receiving sensors included in each pixel have the same crosstalk ratios.

It is assumed that the crosstalk ratio of the first light receiving sensor is C1=C11:C12 and the crosstalk ratio of the second light receiving sensor is C2=C21:C22. Here, the "crosstalk ratio C1 of the first light receiving sensor is C11:C12" means that a ratio between the light rays received from the first optical system and the second optical system is expressed by first optical system:second optical system=C11:C12. That is, this means that the light rays are received from the first optical system at a ratio of C11 and are received from the second optical system at a ratio of C12. Similarly, the "crosstalk ratio C2 of the second light receiving sensor is C21:C22" means that a ratio between the light rays received from the first optical system and the second optical system is expressed by first optical system:second optical system=C21:C22.

Since the image sensor includes two light receiving sensors (the first light receiving sensor and the second light receiving sensor) in one pixel (m=2), two primary image data items are generated by performing imaging once. It is assumed that the primary image data based on the first light receiving sensor is referred to as the first primary image data FI1 and the primary image data based on the second light receiving sensor is referred to as the second primary image data FI2. Crosstalk is caused in the first primary image data FI1 at a ratio of crosstalk ratio C1=C11:C12, and crosstalk is caused in the second primary image data FI2 at a ratio of crosstalk ratio C2=C21:C22.

Figure 13:
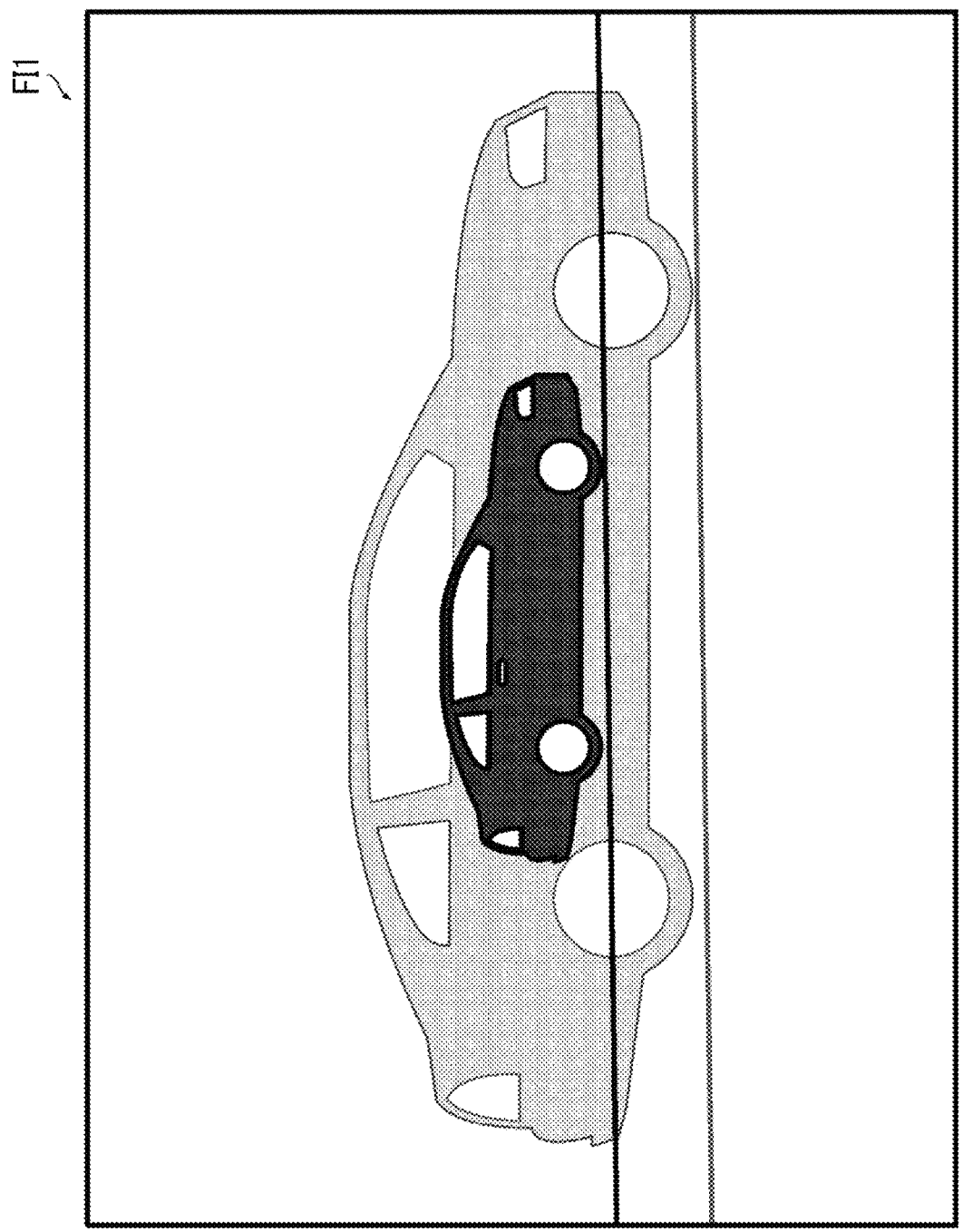
FIG. 13 is a diagram showing an example of an image represented by first primary image data FI1.
Figure 14:
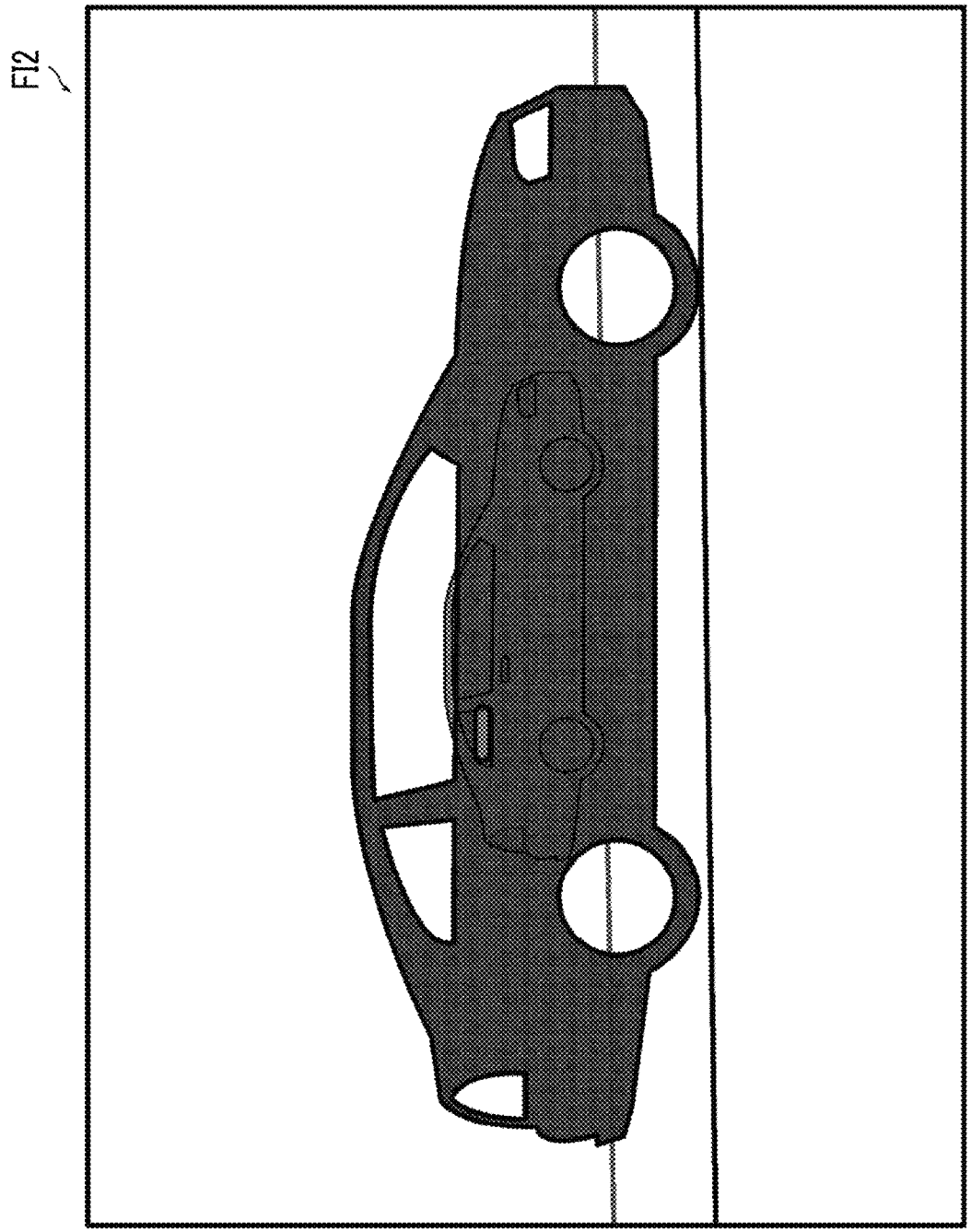
FIG. 14 is a diagram showing an example of an image represented by second primary image data FI2.

FIG. 13 is a diagram showing an example of an image represented by the first primary image data FI1. FIG. 14 is a diagram showing an example of an image represented by the second primary image data FI2. In the examples shown in FIGS. 13 and 14, a case where the crosstalk ratio C1 of the first light receiving sensor is expressed by C11>C12 and the crosstalk ratio C2 of the second light receiving sensor is expressed by C21<C22 is shown. That is, a case where the first light receiving sensor is configured to receive a larger amount of light rays from the first optical system and the second light receiving sensor is configured to receive a larger amount of light rays from the second optical system is shown. In this case, the image (image represented by the first primary image data FI1) obtained from the first light receiving sensor is an image obtained by unnoticeably superimposing an image (telephoto image) of the second optical system on the original image (wide-angle image) of the first optical system as shown in FIG. 13. Meanwhile, the image (image represented by the second primary image data FI2) obtained from the second light receiving sensor is an image obtained by unnoticeably superimposing the image (wide-angle image) of the first optical system on the original image (telephoto image) of the second optical system, as shown in FIG. 14.

As for the secondary image data, since the number of optical systems included in the imaging lens is two (m=2), two secondary image data items are generated. It is assumed that the secondary image data corresponding to the first optical system is first secondary image data SI1 and the secondary image data corresponding to the second optical system is second secondary image data SI2.

Figure 15:
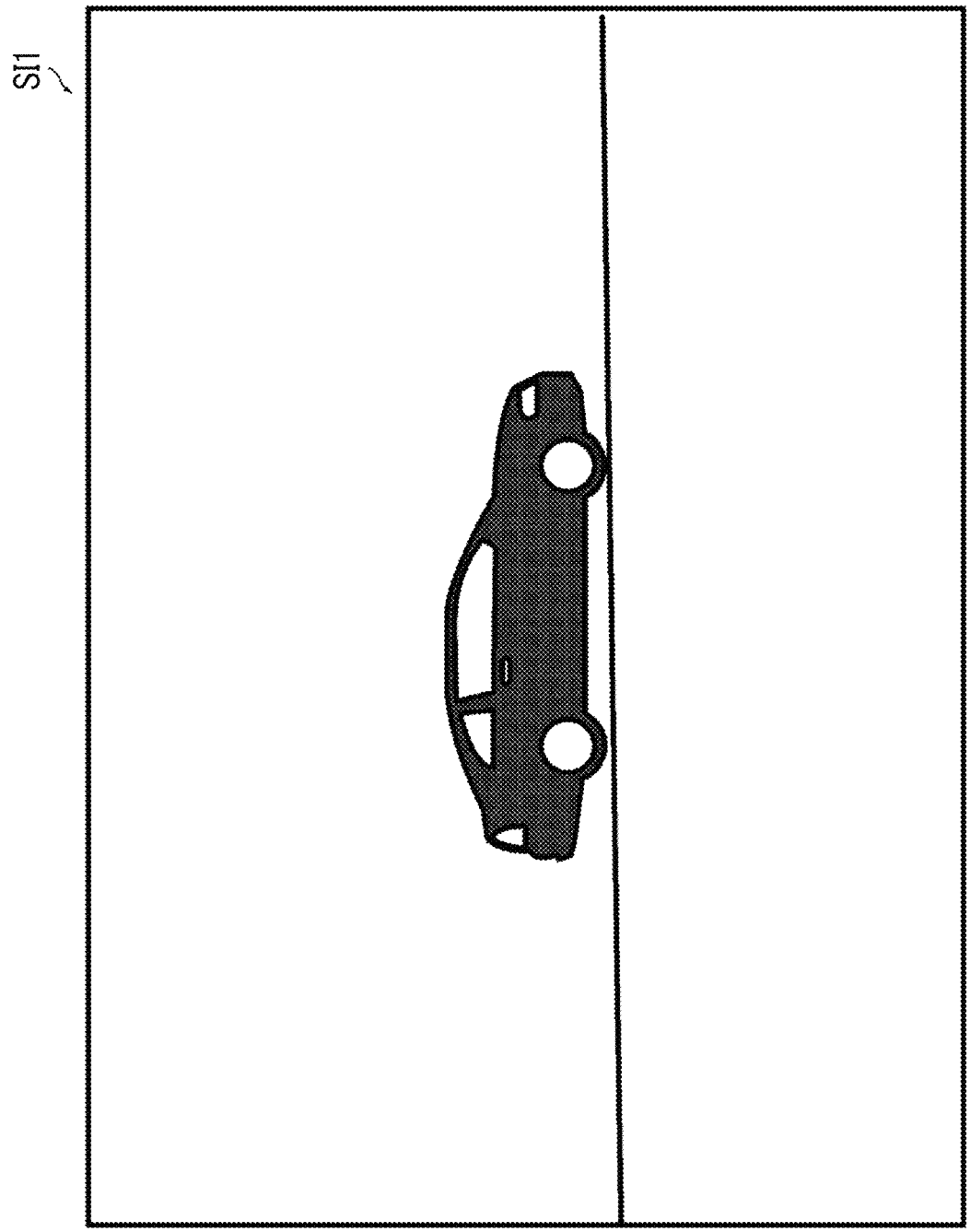
FIG. 15 is a diagram showing an image represented by first secondary image data SI1.
Figure 16:
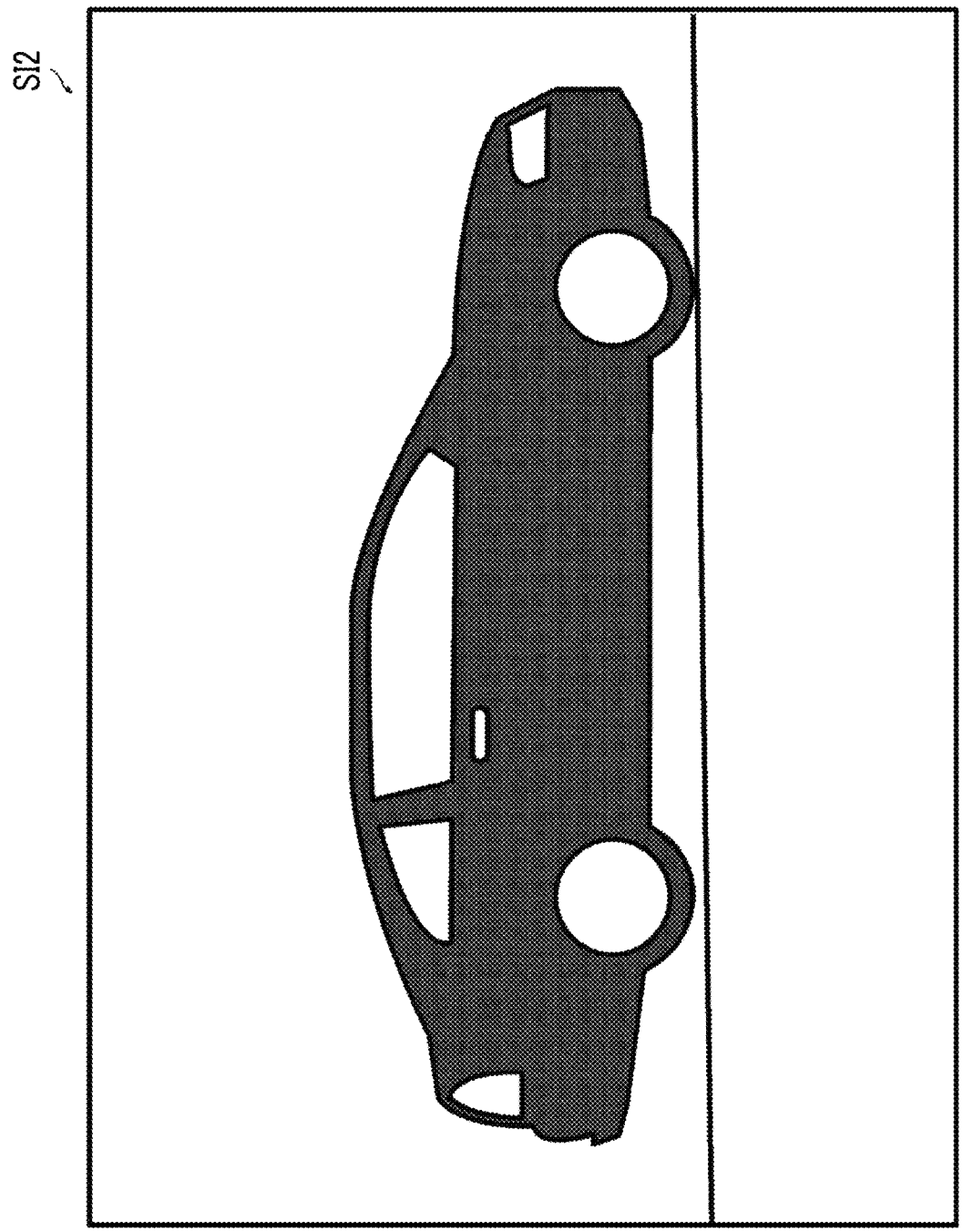
FIG. 16 is a diagram showing an image represented by second secondary image data SI2.

FIG. 15 is a diagram showing an image represented by the first secondary image data SI1, and FIG. 16 is a diagram showing an image represented by the second secondary image data SI2. As shown in FIGS. 15 and 16, the images represented by the first secondary image data SI1 and the second secondary image data SI2 are images obtained by removing the influence of the crosstalk.

It is assumed that a pixel value of the first primary image data FI1 in a specific pixel position (x, y) is A1 and a pixel value of the second primary image data FI2 is A2. It is assumed that a pixel value of the first secondary image data SU in the corresponding pixel is B1 and a pixel value of the second secondary image data SI2 is B2.

The pixel values B1 and B2 of the first secondary image data SI1 and the second secondary image data SI2 may be calculated by solving the following simultaneous equations.

$$A1 = C11*B1 + C12*B2$$

$$A2 = C21*B1 + C22*B2$$

That is, the first primary image data FI1 is data including a component (synonymous with a component of the first optical system) of the first secondary image data SI1 and a component (synonymous with a component of the second optical system) of the second secondary image data SI2 at a ratio of C11:C12. Accordingly, in a case where this relationship is expressed by an expression, the relationship of A1=C11*B1+C12*B2 is established. Similarly, since the second primary image data FI2 is data including a component (a component of the first optical system) of the first secondary image data SI1 and a component (a component of the second optical system) of the second secondary image data SI2 at a ratio of C21:C22, in a case where this relationship is expressed by an expression, the relationship of A2=C21*B1+C22*B2 is established. In a case where this relationship is shown in the drawings, this relationship is shown in FIGS. 17 and 18.

Figure 17:
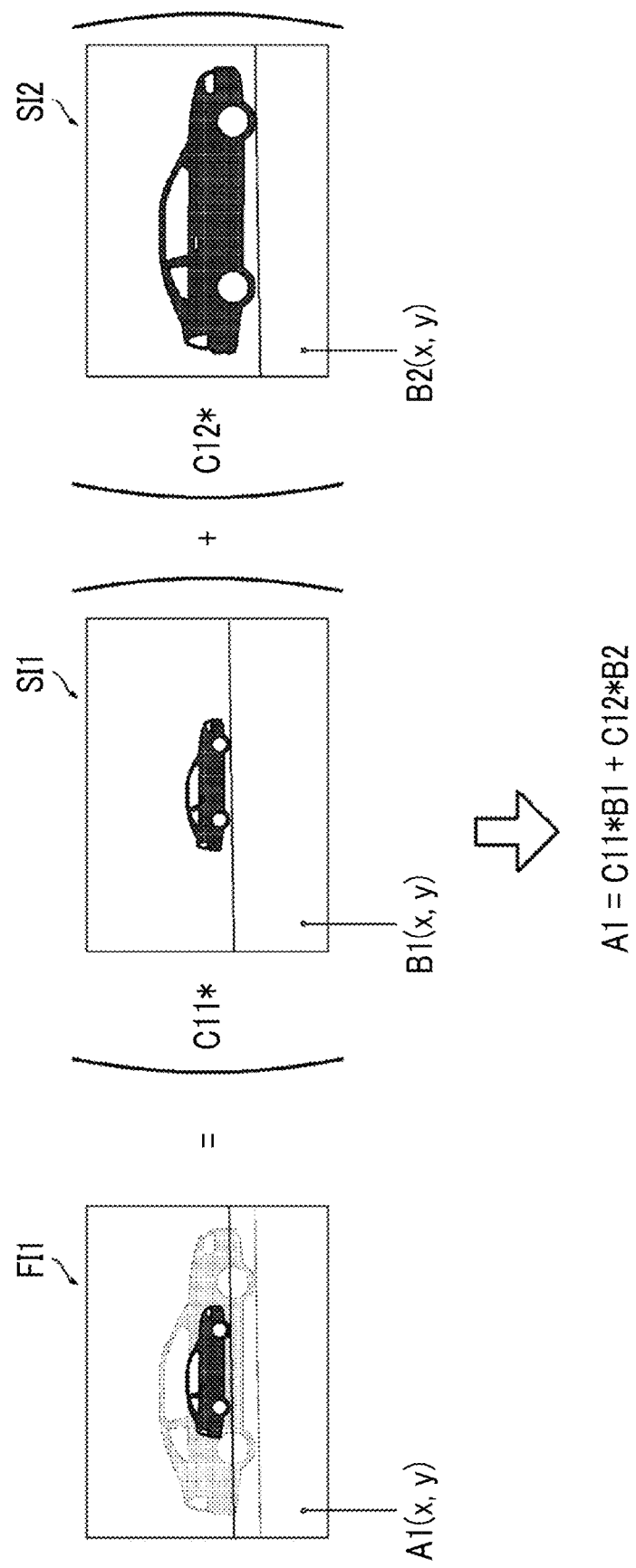
FIG. 17 is a conceptual diagram of a configuration of the first primary image data.

FIG. 17 is a conceptual diagram of a configuration of the first primary image data.

As shown in this drawing, the first primary image data FI1 includes a component of the first secondary image data SI1 at a ratio of C11, and includes a component of the second secondary image data SI2 at a ratio of C12. In a case where this relationship is expressed by an expression, the relationship of A1=C11*B1+C12*B2 is established for the specific pixel position (x, y).

Figure 18:
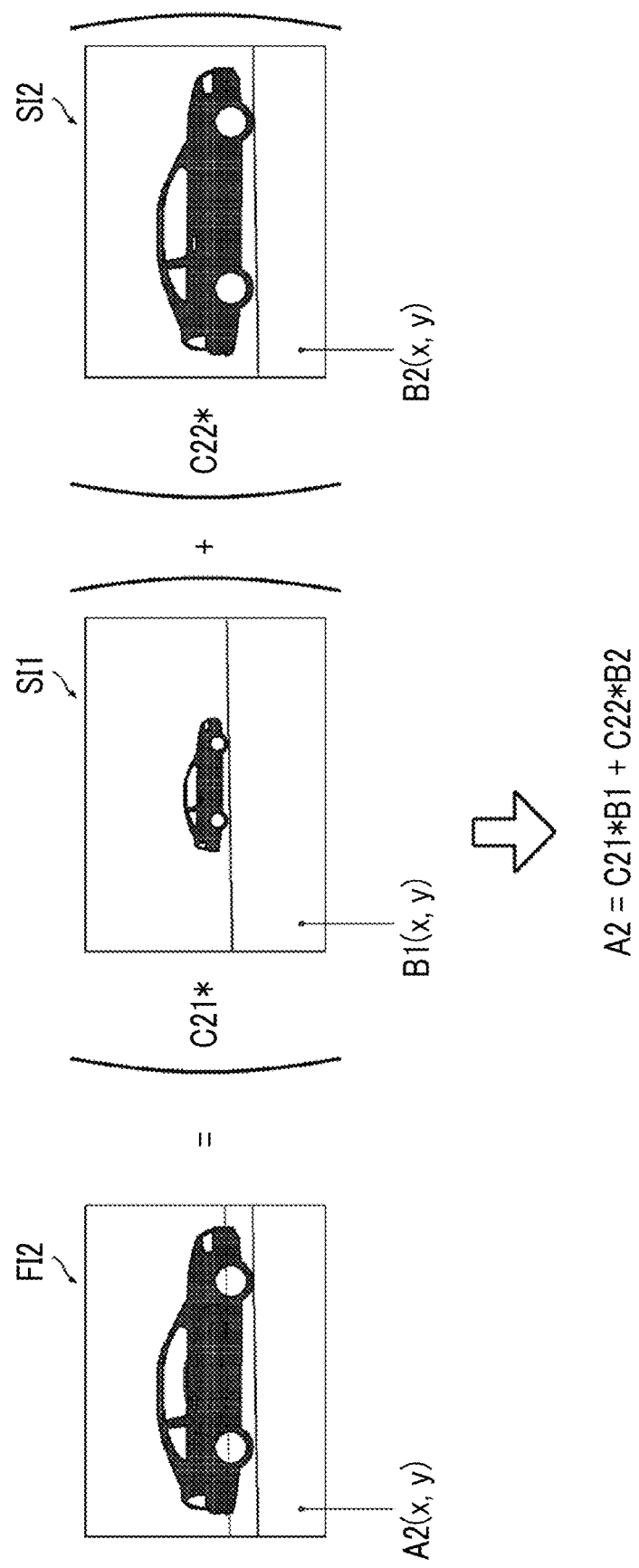
FIG. 18 is a conceptual diagram of a configuration of the second primary image data.

FIG. 18 is a conceptual diagram of a configuration of the second primary image data.

As shown in this drawing, the second primary image data FI2 includes a component of the first secondary image data SI1 at a ratio of C21, and includes a component of the second secondary image data SI2 at a ratio of C22. In a case where this relationship is expressed by an expression, the relationship of A2=C21*B1+C22*B2 is established for the specific pixel position (x, y).

Accordingly, by solving the simultaneous equations for each pixel, the pixel values B1 and B2 of the first secondary image data SU and the second secondary image data SI2 can be calculated, and the first secondary image data SI1 and the second secondary image data SI2 can be generated. By solving the simultaneous equations, the image data items (the first secondary image data SI1 and the second secondary image data SI2) in which the influence of the crosstalk is removed can be generated.

Here, the simultaneous equations can be solved by using a matrix.

Figure 19:
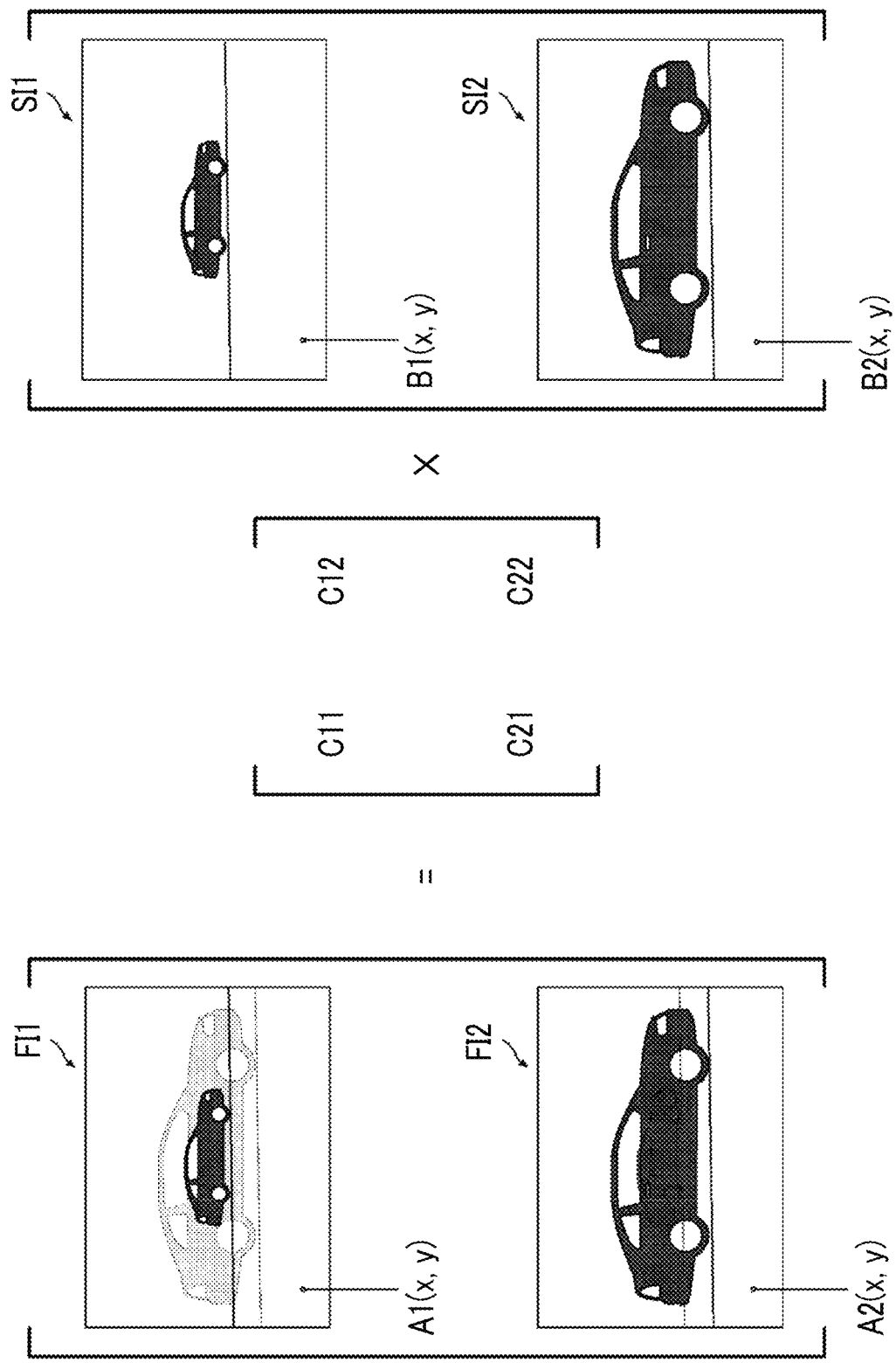
FIG. 19 is a conceptual diagram showing a case where the relationship between the primary image data items and the secondary image data items is represented by using a matrix.
Figure 20:
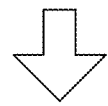
FIG. 20 is a matrix equation representing the relationship between the primary image data items and the secondary image data items.

FIG. 19 is a conceptual diagram showing a case where the relationship between the primary image data items and the secondary image data items is represented by the matrix. FIG. 20 is a matrix equation representing the relationship between the primary image data items and the secondary image data items.

As shown in FIGS. 19 and 20, in a case where a matrix of 2 rows×1 column in which the pixel values A1 and A2 of the first primary image data FI1 and the second primary image data FI2 are elements is A, a matrix of 2 rows×1 column in which the pixel values B1 and B2 of the first secondary image data SI1 and the second secondary image data SI2 are elements is B, and a matrix of 2 rows×2 columns in which the crosstalk ratio C1 of the first light receiving sensor=C11:C12 and the crosstalk ratio C2 of the second light receiving sensor=C21:C22 are elements is C, the simultaneous equation can be expressed by A=C*B.

The pixel values B1 and B2 of the first secondary image data SI1 and the second secondary image data SI2 can be calculated by multiplying both sides of the matrix equation A=C*B by an inverse matrix $C^{-1}$ of C. That is, these pixel values can be calculated by solving $B=C^{-1}*A$.

Figure 21:
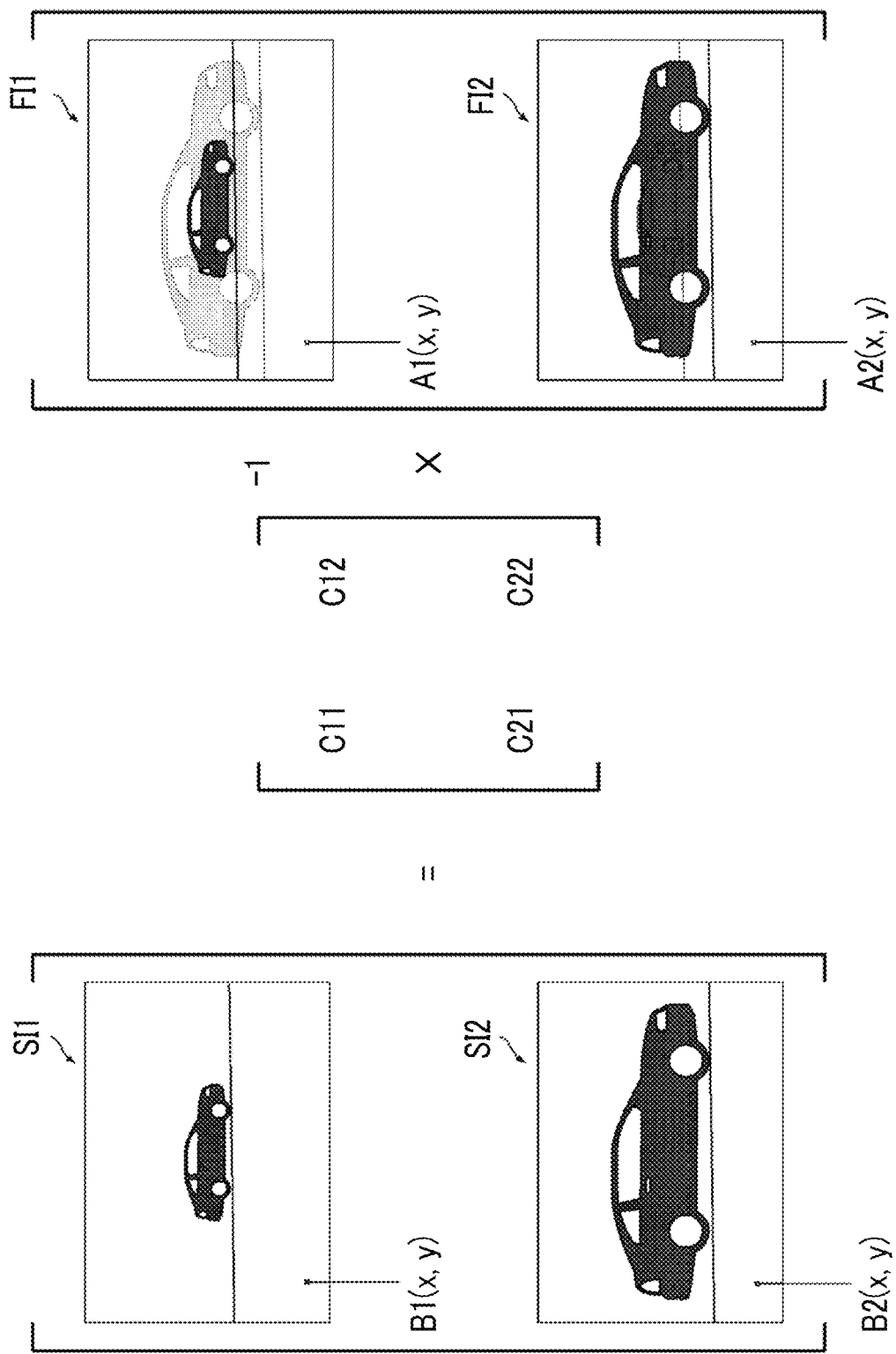
FIG. 21 is a conceptual diagram showing a case where the relationship between the primary image data items and the secondary image data items is represented by using an inverse matrix.
Figure 22:
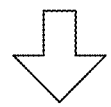
FIG. 22 is a matrix equation representing the relationship between the primary image data items and the secondary image data items by using the inverse matrix.

FIG. 21 is a conceptual diagram a case where the relationship between the primary image data items and the secondary image data items is represented by using the inverse matrix. FIG. 22 is a matrix equation representing the relationship between the primary image data items and the secondary image data items by using the inverse matrix.

As shown in FIGS. 21 and 22, the pixel values B1 and B2 of the first secondary image data SI1 and the second secondary image data SI2 can be calculated by multiplying the matrix A by the inverse matrix $C^{-1}$ of the matrix C.

Since the crosstalk ratios of the light receiving sensors included in each pixel are known, the inverse matrix $C^{-1}$ can be obtained in advance. Accordingly, as long as the pixel values A1 and A2 of the primary image data items can be obtained, the pixel values B1 and B2 of the secondary image data items can be calculated by using the inverse matrix $C^{-1}$.

As mentioned above, the secondary image data items in which the influence of the crosstalk is removed can be generated by performing predetermined calculation processing (crosstalk removal processing) on the primary image data items.

[Crosstalk Removal Processing in Case where m>n]

The case where m>n is a case where the number (m:m is an integer) of light receiving sensors included in each pixel of the image sensor is larger than the number (n: n is an integer satisfying n>1) of optical systems included in the imaging lens. Since the number (n) of optical systems included in the imaging lens 10 is two and the number (m) of light receiving sensors included in each pixel 110 of the image sensor 100 is 9, the imaging device 1 of the present embodiment corresponds to a case where m>n. In this case, the basic concept of the crosstalk removal processing is the same.

FIG. 23 is a conceptual diagram showing the relationship between the primary image data items and the secondary image data items.

It is assumed that the crosstalk ratio C1 of the first light receiving sensor 120a provided in the specific pixel position (x, y) of the image sensor 100 is C1=C11:C12, the crosstalk ratio C2 of the second light receiving sensor 120b is C2=C21:C22, the crosstalk ratio C3 of the third light receiving sensor 120c is C3=C31:C32, the crosstalk ratio C4 of the fourth light receiving sensor 120d is C4=C41:C42, the crosstalk ratio C5 of the fifth light receiving sensor 120e is C5=C51:C52, the crosstalk ratio C6 of the sixth light receiving sensor 120f is C6=C61:C62, the crosstalk ratio C7 of the seventh light receiving sensor 120g is C7=C71:C72, the crosstalk ratio C8 of the eighth light receiving sensor 120h is C8=C81:C82, and the crosstalk ratio C9 of the ninth light receiving sensor 120i is C9=C91:C92.

In this case, the first primary image data FI1 is data including a component (synonymous with a component of the first optical system 20) of the first secondary image data SI1 and a component (synonymous with a component of the second optical system 30) of the second secondary image data SI2 at a ratio of C11:C12. In a case where this relationship is expressed by an expression, the first primary image data FI1 satisfies the relationship of A1=C11*B1+C12*B2 for the specific pixel position (x, y).

The second primary image data FI2 is data including a component of the first secondary image data SI1 and a component of the second secondary image data SI2 at a ratio of C21:C22. In a case where this relationship is expressed by an expression, the second primary image data FI2 satisfies the relationship of A2=C21*B1+C22*B2 for the specific pixel position (x, y).

That is, in a case where the pixel values of the primary image data items are A1, A2, . . . , and A9 in the specific pixel position (x, y) and the pixel values of the secondary image data items are B1 and B2 in the specific pixel positions (x, y), the following relationships are satisfied between the primary image data items and the secondary image data items.

$$A1=C11*B1+C12*B2$$

$$A2=C21*B1+C22*B2$$

$$A3=C31*B1+C32*B2$$

$$A4=C41*B1+C42*B2$$

$$A5=C51*B1+C52*B2$$

$$A6=C61*B1+C62*B2$$

$$A7=C71*B1+C72*B2$$

$$A8=C81*B1+C82*B2$$

$$A9=C91*B1+C92*B2$$

By solving the simultaneous equations, the pixel values B1 and B2 of the first secondary image data SI1 and the second secondary image data SI2 can be calculated, and the first secondary image data SI1 and the second secondary image data SI2 can be generated. By solving the simultaneous equations, the image data items (the first secondary image data SI1 and the second secondary image data SI2) in which the influence of the crosstalk is removed can be generated.

[Solution Using Inverse Matrix]

As stated above, the simultaneous equations can be solved by using the matrix.

Figure 24:
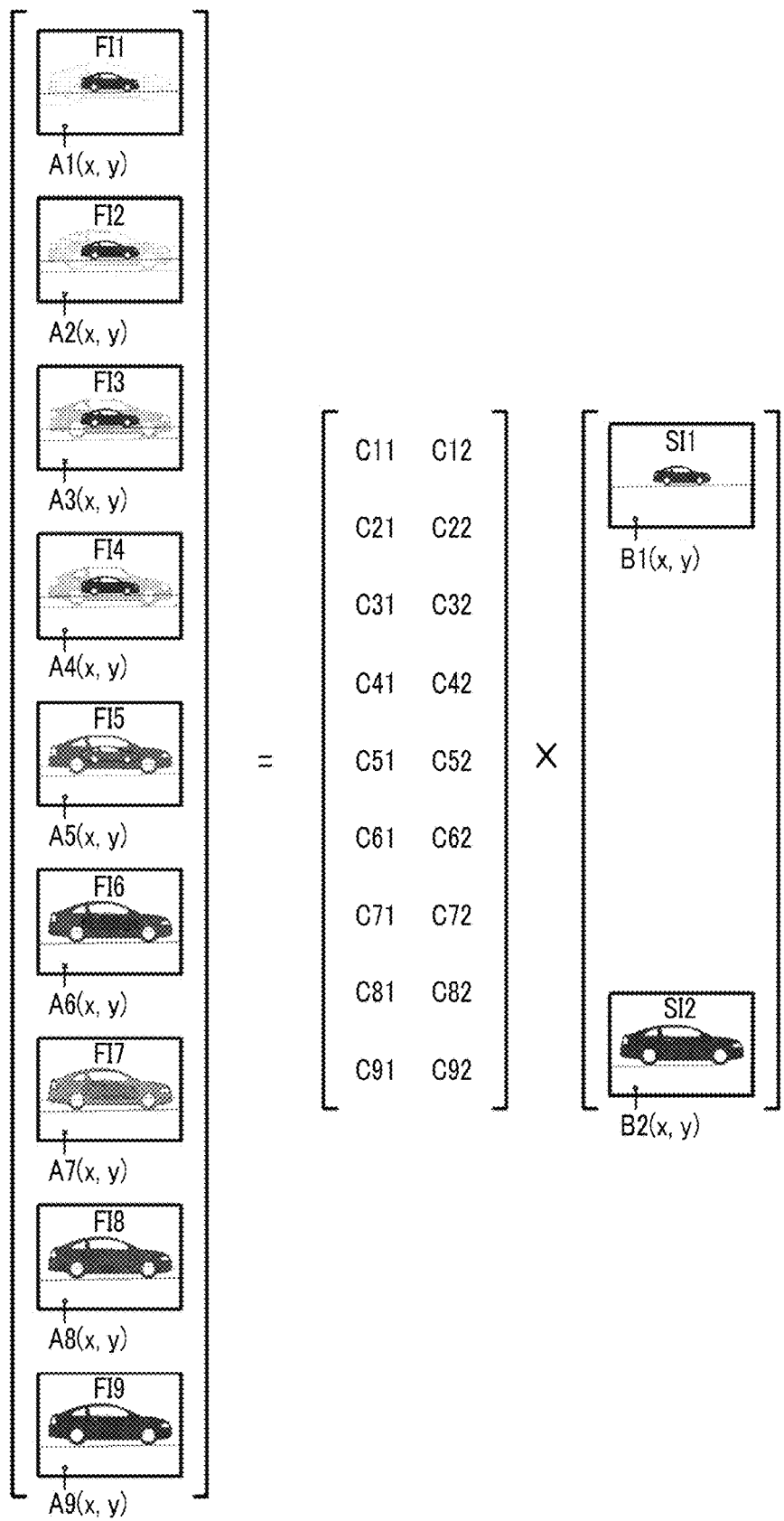
FIG. 24 is a conceptual diagram showing a case where the relationship between the primary image data items and the secondary image data items is represented by using a matrix.
Figure 25:
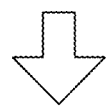
FIG. 25 is a matrix equation representing the relationship between the primary image data items and the secondary image data items.

FIG. 24 is a conceptual diagram showing a case where the relationship between the primary image data items and the secondary image data items is represented by the matrix. FIG. 25 is a matrix equation representing the relationship between the primary image data items and the secondary image data items.

As shown in FIGS. 24 and 25, in a case where a matrix of 9 rows×1 column in which the pixel values A1 to A9 of the primary image data items FI1 to FI9 in the specific pixel position (x, y) are elements is A, a matrix of 2 rows×1 column in which the pixel values B1 and B2 of the secondary image data items SI1 and SI2 in the specific pixel position (x, y) are elements is B, and a matrix of 9 rows×2 columns in which the crosstalk ratios (C1=C11:C12, C2=C21:C22, . . . , and C9=C91:C92) of the light receiving sensors 120a to 120i are elements is C, the simultaneous equation can be expressed by A=C*B.

The pixel values B1 and B2 of the first secondary image data SI1 and the second secondary image data SI2 can be calculated by multiplying both sides of the matrix equation A C*B by an inverse matrix $C^{-1}$ of C. That is, these pixel values can be calculated by solving $B=C^{-1}*A$.

Figure 26:
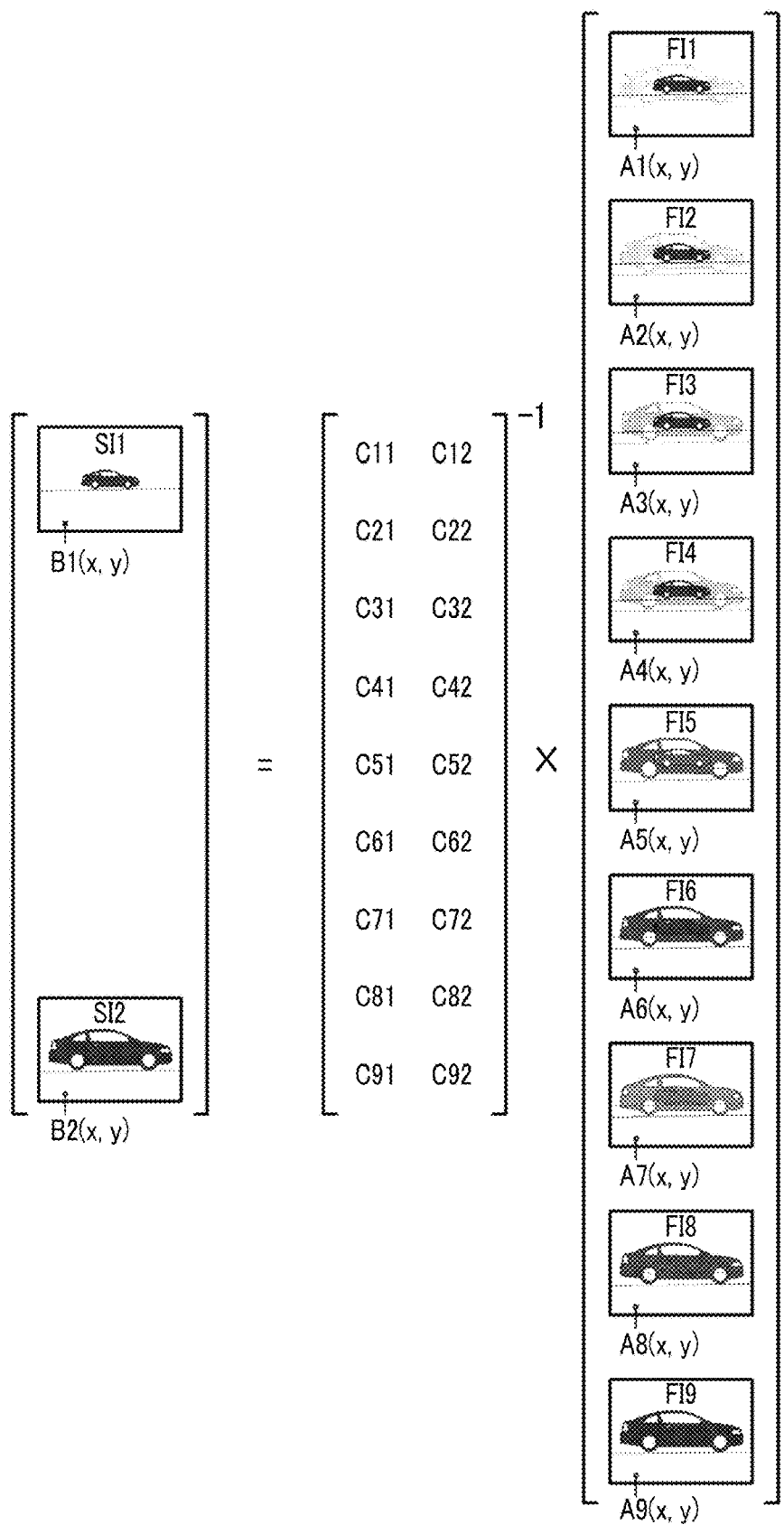
FIG. 26 is a conceptual diagram showing the relationship between the primary image data items and the secondary image data items by using the inverse matrix.
Figure 27:
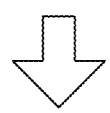
FIG. 27 is a matrix equation representing the relationship between the primary image data items and the secondary image data items by using the inverse matrix.

FIG. 26 is a conceptual diagram showing a case where the relationship between the primary image data items and the secondary image data items is represented by using the inverse matrix. FIG. 27 is a matrix equation representing the relationship between the primary image data items and the secondary image data items by using the inverse matrix.

As shown in FIGS. 26 and 27, the pixel values B1 and B2 of the first secondary image data SI1 and the second secondary image data SI2 can be calculated by multiplying the matrix A by the inverse matrix $C^{-1}$ of the matrix C.

Since the crosstalk ratios of the light receiving sensors included in each pixel are known, the inverse matrix $C^{-1}$ can be obtained in advance.

In a case where the matrix C is not regular, a general inverse matrix of the matrix C is calculated for the inverse matrix $C^{-1}$ thereof, and the inverse matrix $C^{-1}$ is obtained. For example, the general inverse matrix can be calculated by a known method such as a Moore-Penrose inverse matrix.

As stated above, the secondary image data items can be calculated by solving the matrix equation $B=C^{-1}*A$. The secondary image data items in which the influence of the crosstalk is removed can be generated by solving the matrix equation $B=C^{-1}*A$.

<Effect in Case m>n>

As mentioned above, in order to simply remove the influence of the crosstalk is simply removed, the relationship of m=n may be satisfied. That is, the same number of light receiving sensors as the number of optical systems included in the imaging lens may be included in each pixel of the image sensor.

However, in a case where m=n and noise is included in the primary image data, there is a problem that the influence of the noise is generated in the secondary image data.

The inventors of the present application have found that the noise generated in the image in which the crosstalk is removed can be reduced by setting m>n, that is, by setting the number (m) of light receiving sensors included in each pixel of the image sensor to be larger than the number (n) of optical systems included in the imaging lens. Hereinafter, this point will be considered.

[Mechanism of Noise Reduction]

(1) Case where m=n

Initially, a case where m=n is considered. For the sake of convenience in description, it is assumed that the number (n) of optical systems included in the imaging lens is 2. Accordingly, the number (m) of light receiving sensors included in each pixel of the image sensor is also 2. It is assumed that one optical system is the first optical system, and the other optical system is the second optical system. It is assumed that one light receiving sensor is the first light receiving sensor, the light receiving sensor is the second light receiving sensor, the crosstalk ratio of the first light receiving sensor is C1=C11:C12, and the crosstalk ratio of the second light receiving sensor is C2=C21:C22. In this case, the relationship between the primary image data items and the secondary image data items in the specific pixel position (x, y) satisfies A1=C11*B1+C12*B2 and A2=C21*B1+C22*B2.

(A) Case where there is No Crosstalk

A case where there is no crosstalk is a case where each light receiving sensor receives only the light rays from the corresponding optical system. That is, this case is a case where the first light receiving sensor receives only the light rays from the first optical system and the second light receiving sensor receives only the light rays from the second optical system. In a case where the crosstalk ratio of the first light receiving sensor is C1=C11:C12, C11=1, and C12=0. In a case where the crosstalk ratio of the second light receiving sensor is C2, C21=0, and C22=1. Accordingly, the relationship between the primary image data items and the secondary image data items satisfies A1=C11*B1 and A2=C22*B2.

Figure 28:
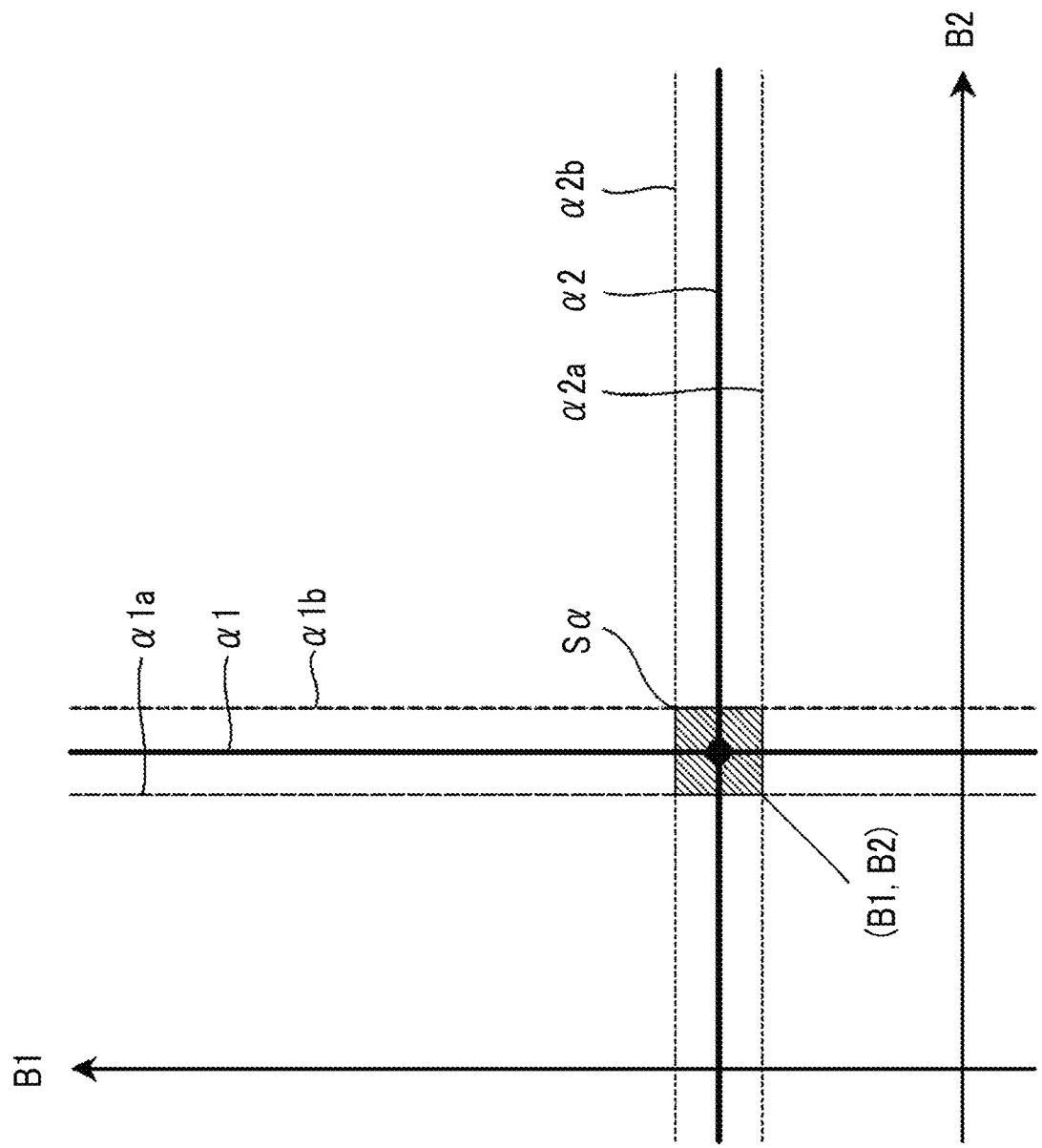
FIG. 28 is a graph showing the relationship between the primary image data items and the secondary image data in a case where there is no crosstalk.

FIG. 28 is a graph showing the relationship between the primary image data items and the secondary image data items in a case where there is no crosstalk. In this drawing, a vertical axis depicts a pixel value B1 of the first secondary image data, and a horizontal axis depicts a pixel value B2 of the second secondary image data.

In FIG. 28, a straight line α1 represented by a solid line is a straight line indicating an expression A1=C11*B1 in a case where there is no noise. A straight line α2 represented by a solid line is a straight line indicating an expression A2=C22*B2 in a case where there is no noise.

In a case where there is no crosstalk, the primary image data items and the secondary image data items have one-to-one correspondence. In this case, noise generated in the primary image data is generated only on the corresponding secondary image data.

The noise generated in the primary image data is generated as an error in solution of two equations. In FIG. 28, a straight line α1a and a straight line α1b represented by dashed lines are straight lines indicating an expression A1=C11*B1 in a case where noise is generated in the primary image data. A straight line α2a and a straight line α2b are straight lines indicating an expression A2=C22*B2 in a case where noise is generated in the primary image data. In a case where noise is generated in the primary image data, the straight line of each expression swings. That is, the straight line of each expression moves in parallel from the position represented by the solid line.

A range in which the straight line of each expression swings is a range of a possible error. In a case where positions of the straight lines α1a, α1b, α2a, and α2b represented by the dashed lines are the maximum positions of the possible swing, a region Sa represented by diagonal lines is a range of a possible error.

In a case where there is no crosstalk, since the noise generated in the primary image data is generated only in the corresponding secondary image data, the influence thereof is limited.

(B) Case where there is No Crosstalk

In a case where there is no crosstalk, the relationship between the primary image data items and the secondary image data items in the specific pixel position (x, y) satisfies A1=C11*B1+C12*B2 and A2=C21*B1+C22*B2.

Figure 29:
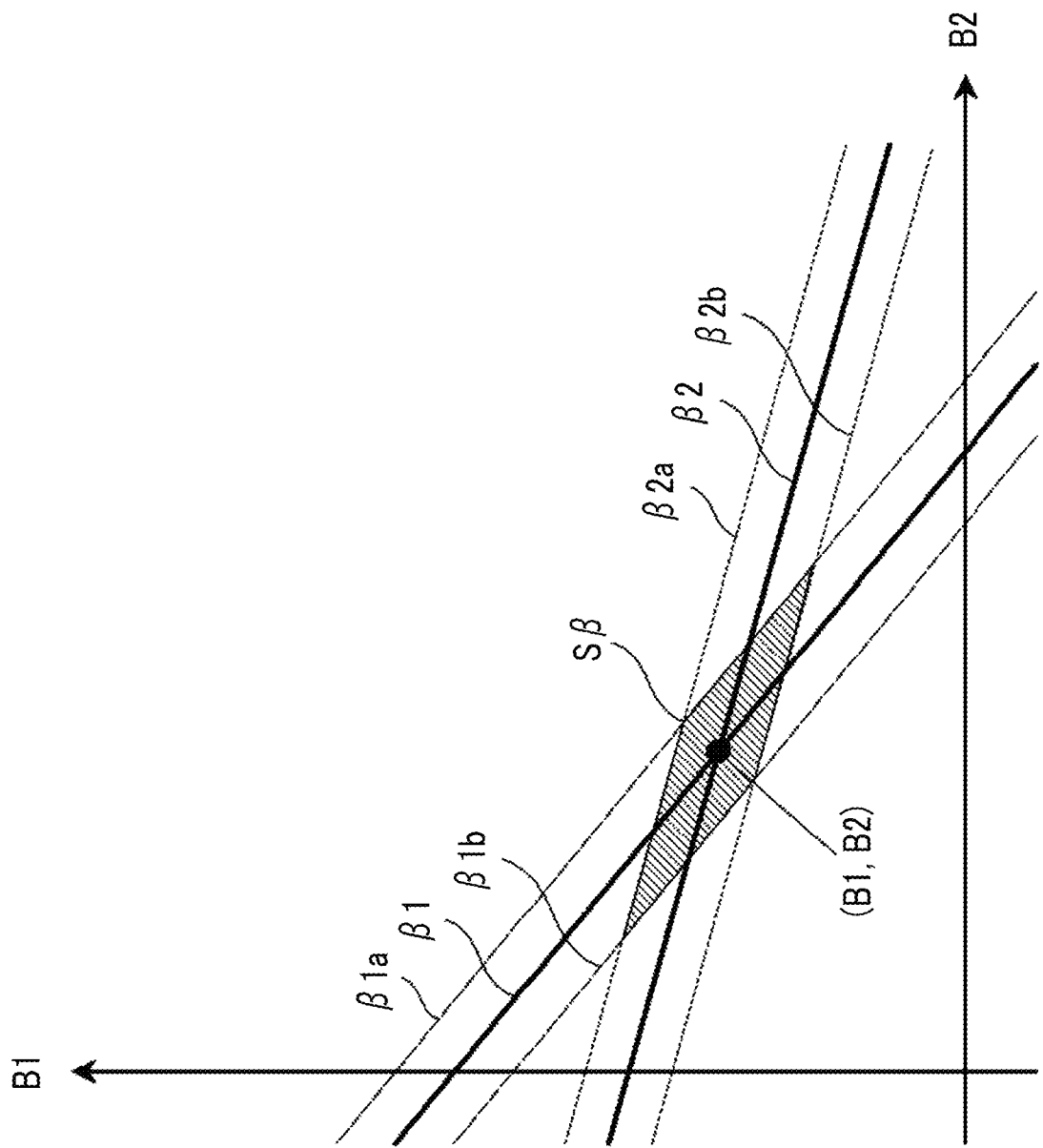
FIG. 29 is a graph showing the relationship between the primary image data items and the secondary image data items in a case where there is crosstalk.

FIG. 29 is a graph showing the relationship between the primary image data items and the secondary image data items in a case where there is crosstalk. In this drawing, a vertical axis depicts a pixel value of the first secondary image data, and a horizontal axis depicts a pixel value of the second secondary image data.

In FIG. 29, a straight line 131 represented by a solid line is a straight line indicating an expression A1=C11*B1+C12*B2 in a case where there is no noise. A straight line β2 represented by a solid line is a straight line indicating an expression A2=C21*B1+C22*B2 in a case where there is no noise.

As shown in FIG. 29, each straight line is inclined in a case where there is crosstalk. The inclination increases as the crosstalk component increases. An angle formed by two straight lines increases as the inclination increases.

As stated above, the noise generated in the primary image data is generated as an error in solution of two expressions. In FIG. 29, a straight line β1a and a straight line β1b represented by dashed lines are straight lines indicating an expression A1=C11*B1+C12*B2 in a case where noise is generated in the primary image data. A straight line β2a and a straight line β2b are straight lines indicating an expression A2=C21*B1+C22*B2 in a case where noise is generated in the primary image data. In a case where noise is generated in the primary image data, the straight line of each expression swings.

A range in which the straight line of each expression swings is a range of a possible error. In a case where positions of the straight lines β1a, β1b, β2a, and β2b represented by the dashed lines are maximum position of possible swing, a region SP represented by diagonal lines is a range of a possible error. As shown in FIG. 29, this range increases as an angle formed by two straight lines increases. As stated above, the angle formed by two straight lines increases as the crosstalk component of each light receiving sensor increases. Accordingly, as the crosstalk component increases, the influence of the noise increases. That is, noise is easily amplified.

(2) Case where m>n

Hereinafter, a case where m>n is considered. For the sake of convenience in description, it is assumed that the number (n) of optical systems included in the imaging lens is two and the number (m) of light receiving sensors included in each pixel of the image sensor is 3. It is assumed that one optical system is the first optical system, the other optical system is the second optical system, and three light receiving sensors are respectively the first light receiving sensor, the second light receiving sensor, and the third light receiving sensor. It is assumed that the crosstalk ratio of the first light receiving sensor is C1=C11:C12, the crosstalk ratio of the second light receiving sensor is C2=C21:C22, and the crosstalk ratio of the third light receiving sensor is C3=C31:C32. In this case, the relationship between the primary image data items and the secondary image data items in the specific pixel position (x, y) satisfies A1=C11*B1+C12*B2, A2=C21*B1+C22*B2, and A3=C31*B1+C32*B2.

Figure 30:
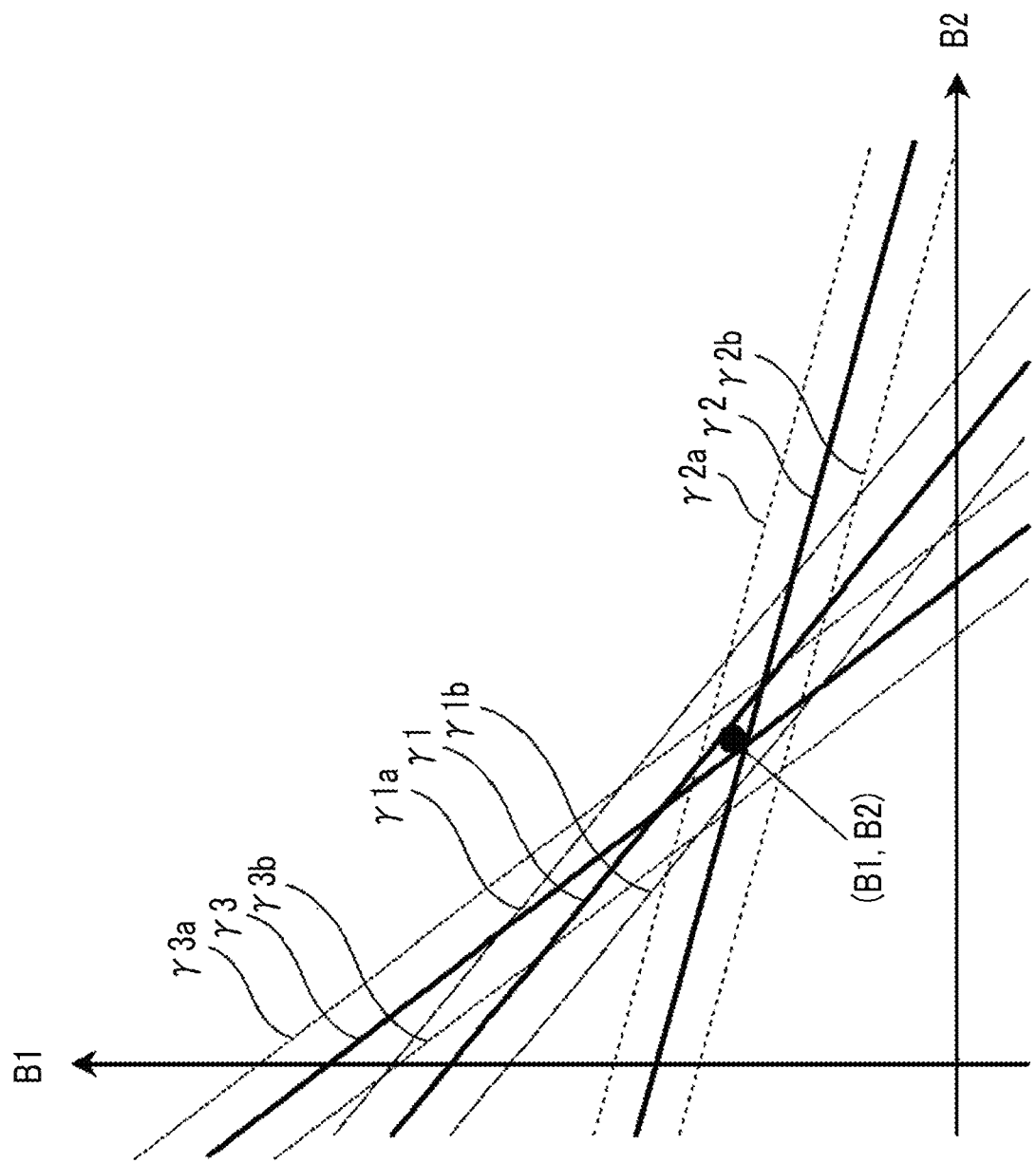
FIG. 30 is a graph showing the relationship between the primary image data items and the secondary image data items in a case where m>n.

FIG. 30 is a graph showing the relationship between the primary image data items and the secondary image data items in a case where m>n. In this drawing, a vertical axis depicts a pixel value of the first secondary image data, and a horizontal axis depicts a pixel value of the second secondary image data.

In FIG. 30, a straight line γ1 represented by a solid line is a straight line indicating an expression A1=C11*B1+C12*B2 in a case where there is no noise. A straight line γ2 represented by a solid line is a straight line indicating an expression A2=C21*B1+C22*B2 in a case where there is no noise. A straight line γ3 represented by a solid line is a straight line indicating an expression A3=C31*B1+C32*B2 in a case where there is no noise.

In FIG. 30, straight lines γ1a and γ1b represented by dashed lines are straight lines indicating an expression A1=C11*B1+C12*B2 in a case where noise is generated in the primary image data. Straight lines γ2a and γ2b represented by dashed lines are straight lines indicating an expression A2=C21*B1+C22*B2 in a case where noise is generated in the primary image data. Straight lines γ3a and γ3b represented by dashed lines are straight lines indicating an expression A3=C31*B1+C32*B2 in a case where noise is generated in the primary image data items.

The number (m) of light receiving sensors included in one pixel increases, and thus, the number (number (=m) of straight lines) of expressions for calculating the secondary image data increases. The number of expressions increases, and thus, the distribution of solutions is converged. As a result, the influence of the noise generated in the primary image data items on the secondary image data can be reduced.

As stated above, the number of expressions for calculating the secondary image data increases, and thus, the influence of the noise generated in the secondary image data can be reduced. The number of expressions for calculating the secondary image data increases, and thus, the convergence of the solutions is further improved. Accordingly, it is preferable that the number of light receiving sensors included in one pixel is large.

In order to further improve the convergence, a case where the light receiving sensors having various crosstalk ratios are provided is more preferable than a case where the light receiving sensors having approximate crosstalk ratios are provided. That is, it is preferable that the crosstalk ratio of each light receiving sensor is varied.

<<Configuration of Digital Signal Processing Unit>>

The series of signal processing is performed by the digital signal processing unit 216. The digital signal processing unit 216 generates the primary image data items by obtaining the image signals from each light receiving sensor of each pixel of the image sensor 100, and generates the secondary image data corresponding to each optical system by performing the crosstalk removal processing on the primary image data for each pixel.

Figure 31:
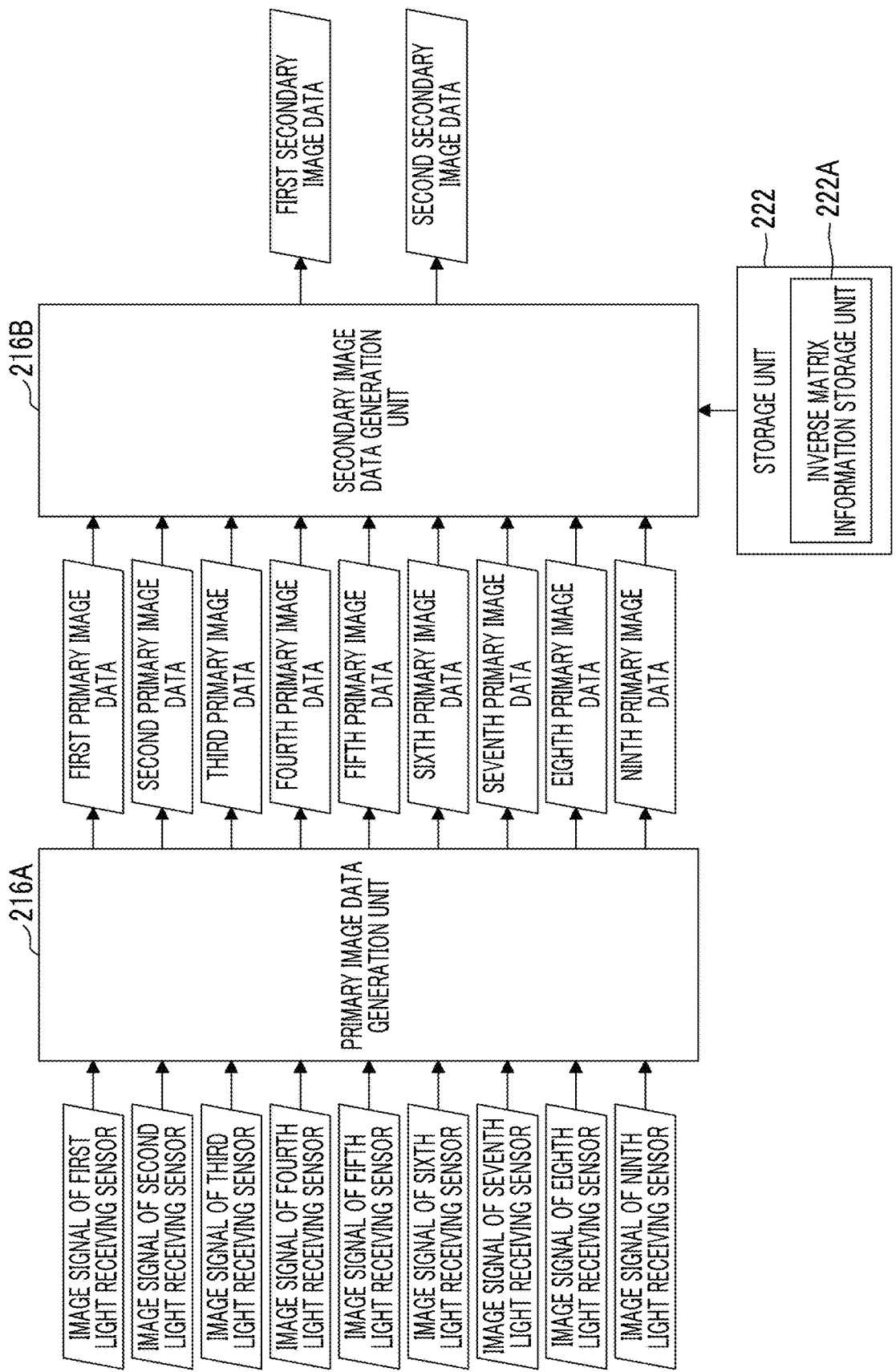
FIG. 31 is a block diagram of a function of a digital signal processing unit.

FIG. 31 is a block diagram of a function of the digital signal processing unit.

A primary image data generation unit 216A that generates the primary image data items, and a secondary image data generation unit 216B that generates the secondary image data items are provided.

The primary image data generation unit 216A obtains the image signals of the corresponding light receiving sensor from each pixel of the image sensor, and generates m number of primary image data items. Since the imaging device 1 of the present embodiment includes nine (m=9) light receiving sensors 120a to 120i of each pixel 110 of the image sensor 100, the imaging device generates nine primary image data items.

The secondary image data generation unit 216B generates n number of secondary image data items corresponding to the optical systems by performing the crosstalk removal processing on the nine primary image data items generated by the primary image data generation unit 216A for each pixel. Since the imaging device 1 of the present embodiment includes two (n=2) optical systems in the imaging lens 10, two secondary image data items are generated. Specifically, the first secondary image data corresponding to the first optical system 20 and the second secondary image data corresponding to the second optical system 30 are generated.

The crosstalk removal processing is processing for solving the simultaneous equations of A1=C11*B1+C12*B2+ . . . +C1n*Bn, A2=C21*B1+C22*B2+ . . . +C2n*Bn, . . . , and Am=cm1*B1+cm2*B2+ . . . +Cmn*Bn. Since m=9 and n=2, the imaging device 1 of the present embodiment generates the secondary image data items corresponding to the optical systems by solving the simultaneous equations A1=CC11*B1+C12*B2, A2=C21*B1+C22*B2, and A3=C31*B1+C32*B2.

The secondary image data generation unit 216B performs processing for solving the simultaneous equations by using the matrix. That is, the secondary image data items are generated by solving the matrix equation $B=C^{-1}*A$. Information of the inverse matrix $C^{-1}$ used in the calculation is stored in the storage unit 222. The storage unit 222 includes an inverse matrix information storage unit 222A that stores the information of the inverse matrix $C^{-1}$ in a part of a storage region thereof. The information of the inverse matrix $C^{-1}$ is stored for each pixel.

The secondary image data generation unit 216B reads out the information of the inverse matrix $C^{-1}$ for each pixel to be processed, and performs the crosstalk removal processing.

<<Flow of Processing in Imaging Device (Image Data Generation Method)>>

In the imaging device of the present embodiment, image data items for recording are generated in order of (1) exposing based on an imaging instruction (exposing step), (2) generation of the primary image data based on the exposing (primary image data generation step), (3) generation of the secondary image data based on primary image data (secondary image data generation step).

The imaging (exposing) for recording is performed based on an instruction from the operating unit 228. Here, it is assumed that an instruction to perform the imaging for recording is transmitted by fully pressing the shutter button. A photographer performs the focus adjustment of each optical system, and then instructs that the imaging for recording is performed by fully pressing the shutter button.

In a case where the shutter button is fully pressed, photometric processing is initially performed. An exposure value (EV value) is calculated based on the image signals obtained from the system controller 226 and the image sensor 100, and the exposure is determined.

In a case where the exposure is determined, the image sensor 100 is exposed by using the determined exposure (exposing step). Electric charges are accumulated in the photoelectric conversion elements 130 of the light receiving sensors 120a to 120i through the exposing. The image sensor 100 reads out an electric charge amount accumulated in the photoelectric conversion element 130 of each of the light receiving sensors 120a to 120i, and outputs the image signal corresponding to the electric charge amount.

The image signal output from the image sensor 100 is taken into the work memory 220 through the analog signal processing unit 214. The digital signal processing unit 216 performs predetermined signal processing on the image signals taken into the work memory 220, and thus, the image data items (the first secondary image data and the second secondary image data) corresponding to the optical systems are generated. That is, the image signals of the light receiving sensors are obtained for each pixel, nine primary image data items are generated (primary image data generation step), and the crosstalk removal processing is performed on the nine primary image data items. Thus, the image data items (the first secondary image data and the second secondary image data) corresponding to the optical systems are generated (secondary image data generation step). The generated image data items (the first secondary image data and the second secondary image data) are converted in a predetermined data format if necessary, and is recorded in the external memory 230.

As stated above, according to the imaging device 1 of the present embodiment, the images corresponding to the optical systems can be simultaneously captured by performing an operation once.

The image data items (the first secondary image data and the second secondary image data) corresponding to the optical systems are generated based on the nine primary image data items, and thus, noise can be reduced.

Second Embodiment

Figure 32:
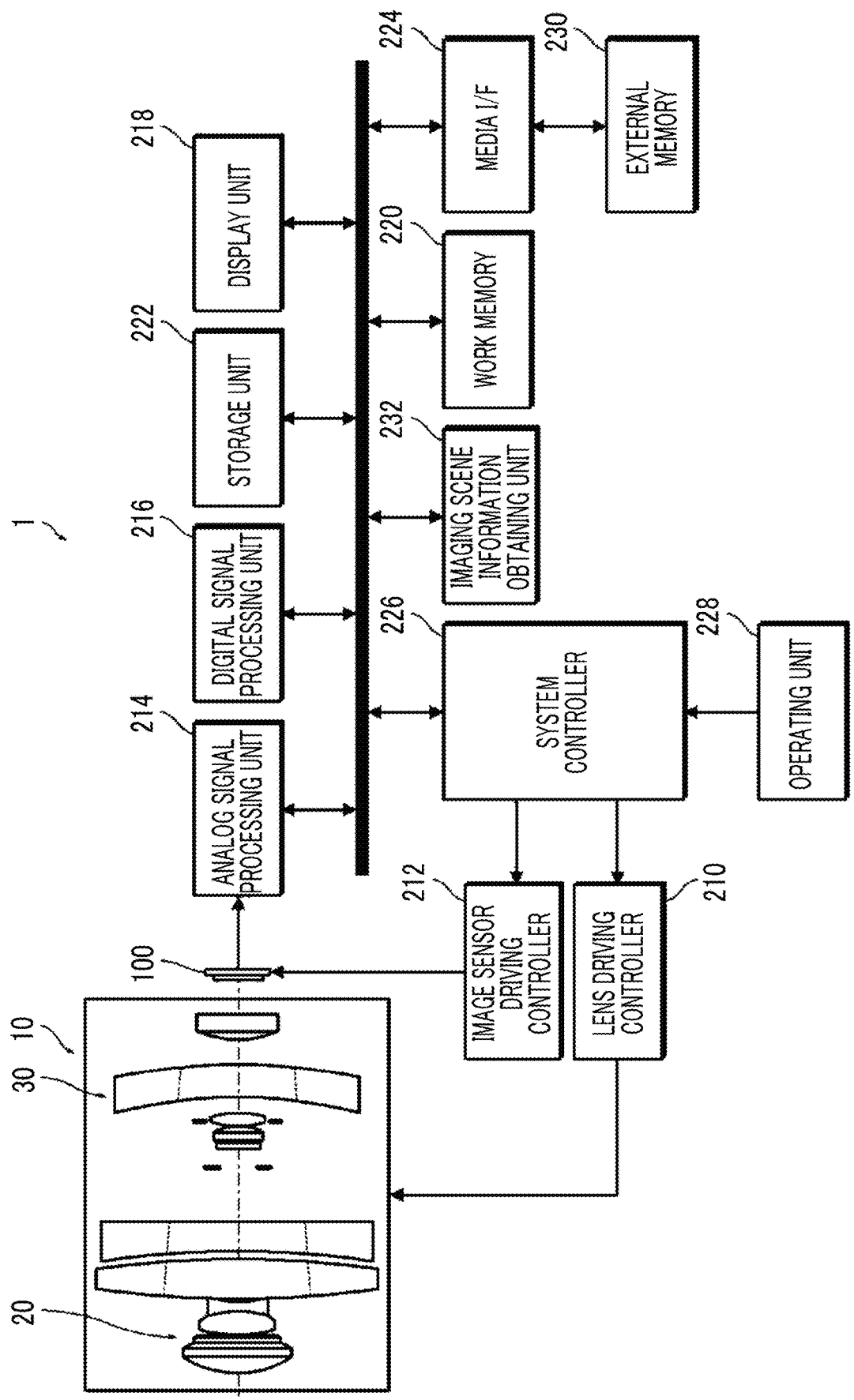
FIG. 32 is a block diagram showing a system configuration of a second embodiment of the imaging device.

FIG. 32 is a block diagram showing a system configuration of a second embodiment of the imaging device.

The imaging device 1 of the present embodiment is different from the imaging device of the first embodiment in that an imaging scene information obtaining unit 232 is further provided.

The imaging scene information obtaining unit 232 obtains information of an imaging scene. The information of the imaging scene is information indicating which scene is to be captured. For example, the information of the imaging scene corresponds to information such as portrait, group photo, landscape, night view, sports, or macro.

The imaging device 1 of the present embodiment switches the processing contents in the digital signal processing unit 216 based on the information of the imaging scene obtained by the imaging scene information obtaining unit 232. Specifically, the number of primary image data items to be used in the generation of the secondary image data items is switched.

As stated above, the noise generated in the secondary image data can be reduced by increasing the number of primary image data items. Meanwhile, a noise level to be allowed is different for each imaging scene. For example, a portrait needs to have a high level and low noise compared to a landscape.

In the imaging device 1 of the present embodiment, the number of primary image data items to be used in the generation of the secondary image data items is switched depending on the imaging scene. For example, the number of primary image data items to be used in the generation of the secondary image data items is increased on an imaging scene in which noise is concerned. Accordingly, it is possible to suppress the generation of noise. Meanwhile, the number of primary image data items to be used in the generation of the secondary image data items is decreased on an imaging scene in which noise is not concerned. Accordingly, it is possible to reduce a calculation load involved in the crosstalk removal processing, and it is possible to increase a processing speed.

In the imaging device 1 of the present embodiment, the information of the imaging scene is input by a user through the operating unit 228. The imaging scene information obtaining unit 232 obtains the information input through the operating unit 228, and obtains the information of the imaging scene. The user selects an imaging scene prepared in advance, and thus, the input is performed. For example, scenes such as portrait, group photo, landscape, night view, sports, and macro may be prepared as the imaging scene.

The system controller 226 switches the number of primary image data items to be used in the generation of the secondary image data items based on the information of the imaging scene obtained by the imaging scene information obtaining unit 232. The relationship between the imaging scene and the number of primary image data items to be used in the generation of the secondary image data items is determined in advance, and is managed as a table. Information items of the primary image data items to be used are also recorded in the table. That is, information items indicating that the primary image data items based on the light receiving sensor positioned in a certain position are to be used are recorded. The table is stored in the storage unit 222. The system controller 226 determines the primary image data items to be used in the generation of the secondary image data items while referring to the table stored in the storage unit 222.

The digital signal processing unit 216 generates the secondary image data items according to an instruction from the system controller 226. That is, the secondary image data items are generated by performing the crosstalk removal processing on the primary image data items determined by the instruction from the system controller 226.

As stated above, in the imaging device 1 of the present embodiment, the number of primary image data items to be used in the generation of the secondary image data items is changed depending on the imaging scene. Accordingly, it is possible to appropriately generate the secondary image data items.

Although it has been described in the embodiment that the information of the imaging scene is input by the user, the imaging scene may be automatically specified by analyzing the image obtained through the imaging. In this case, the imaging scene information obtaining unit functions as an image analysis unit, and specifies the imaging scene by analyzing at least one primary image data.

OTHER EMBODIMENTS

Modification Example of Image Sensor

The number (m) of light receiving sensors included in each pixel of the image sensor may be larger than the number (n) of optical systems included in the imaging lens. That is, it is sufficient to satisfy the relationship of m>n.

It is preferable that the crosstalk ratios of the light receiving sensors included in each pixel are distributed. That is, it is preferable that a plurality of light receiving sensors having various crosstalk ratios rather than a plurality of light receiving sensors having approximate crosstalk ratios is provided.

Although it has been described in the embodiment that the nine light receiving sensors disposed in 3 rows×3 columns (3×3) constitute one pixel of the image sensor, the arrangement of the light receiving sensors constituting one pixel is not limited thereto. For example, in a case where one pixel is constituted by three light receiving sensors, one pixel of the image sensor can be constituted by three light receiving sensors disposed in 1 row×3 columns (1×3). The light receiving sensors constituting one pixel may be discretely disposed on the light reception surface.

Although it has been described in the embodiment that a color image is not mentioned for the sake of convenience in description, color filters is disposed in each pixel in a predetermined filter array in a case where the color image is generated.

<<Method of Adjusting Crosstalk Ratio>>

Although it has been described in the embodiment that the crosstalk ratios of the light receiving sensors are adjusted depending on the shape of the light shielding mask, a method of adjusting the crosstalk ratios of the light receiving sensors is not limited thereto. For example, it is possible to adjust the crosstalk ratios by changing image forming characteristics of the microlens. For example, it is possible to change the crosstalk ratios by changing a lens power, a magnification, or an imaging position of the microlens. In this case, the light shielding mask is not needed.

It is possible to adjust the crosstalk ratios by using both the light shielding mask and the microlens. That is, it is possible to adjust the crosstalk ratios by changing both the shape of the light shielding mask and the image forming characteristics of the microlens.

Modification Example of Imaging Lens

Although it has been described in the embodiment that two optical systems are included in the imaging lens, the number (n) of optical systems included in the imaging lens is not limited thereto. Two or more optical systems of which imaging characteristics are different from each other may be included in the imaging lens.

Although it has been described in the embodiment that the optical systems of which focal lengths are different are included in the imaging lens, the kind of the optical system included in the imaging lens is not limited thereto. For example, the optical systems of which focusing distances are different from each other may be provided. Accordingly, images of which focusing distances are different from each other, such as an image focused on a subject present in a short range and an image focused on a subject present in a long range, can be simultaneously captured. For example, optical systems of which transmission wavelength characteristics are different from each other may be provided. Accordingly, an optical system that transmits light rays of an infrared light range and an optical system that transmits light rays of a visible light range are provided, and thus, an infrared light image and a visible light image can be simultaneously captured.

Although it has been described in the embodiment that the plurality of optical systems is concentrically disposed, the arrangement of the plurality of optical systems is not limited thereto. For example, a region may be divided in a circumferential direction by using an optical axis as a center, and the optical systems may be disposed in the regions.

Modification Example of Crosstalk Removal Processing

As stated above, in a case where the crosstalk removal processing is performed for each pixel by using the matrix, the information of the inverse matrix $C^{-1}$ is read out for each pixel, and the crosstalk removal processing is performed. Accordingly, the information of the inverse matrix $C^{-1}$ is stored in the inverse matrix information storage unit 222A for each pixel. Meanwhile, the crosstalk ratios of the light receiving sensors included in each pixel approximate between the pixels, a representative inverse matrix may be determined, and the crosstalk removal processing may be performed. That is, the crosstalk removal processing may be performed by using a common inverse matrix to the pixels. Accordingly, it is possible to reduce a calculation load. A screen may be divided into a plurality of regions, and a common inverse matrix may be determined for each region.

<<Generalization of Crosstalk Removal Processing>>

In a case where the number of optical systems included in the imaging lens is n and the number of light receiving sensors included in each pixel of the image sensor is m (m>n), m number of primary image data items are generated, and n number of secondary image data items are generated. In this case, the pixel values of the primary image data items are A1, A2, . . . , and Am, the pixel values of the secondary image data items are B1, B2, . . . , and Bn, and the crosstalk ratios are C1=C11:C12: . . . :C1n, C2=C21:C22: . . . :C2n, . . . , and Cm=Cm1:Cm2: . . . Cmn, the digital signal processing unit 216 generates the secondary image data items by solving the following simultaneous equations A1=C11*B1+C12*B2+ . . . +C1n*Bn, A2=C21*B1+C22*B2+ . . . +C2n*Bn, . . . , and Am=Cm1*B1+Cm2*B2+ . . . +Cmn*Bn, as the crosstalk removal processing.

In a case where the matrix C in m rows×n columns in which the crosstalk ratios of the light receiving sensors C1=C11:C12: . . . :C1n, C2=C21:C22: . . . :C2n, . . . , and Cm=Cm1:Cm2: . . . :Cmn are elements is not regular, the general inverse matrix of the matrix C is calculated, and the matrix equation is solved.

Example

The following test is performed in order to check the effects of the present invention.

A test in which the primary image data items are artificially generated and noise generated in the secondary image data is compared in a case where m=n and a case where m>n was performed.

<Generation of Primary Image Data>

The primary image data items were artificially generated by combining to image data items W and T. The number of images to be combined corresponds to the number (n) of optical systems included in the imaging lens. Since two image data items W and T are combined, n=2.

The number of primary image data items to be generated corresponds to the number (m) of light receiving sensors included in each pixel of the image sensor. Accordingly, in a case where the number of primary image data items to be generated is 2, m=n.

A combination ratio (ratio at which two image data items W and T are combined) at the time of combination corresponds to the crosstalk ratio of each light receiving sensor. For example, in a case where the two image data items W and T are combined at a combination ratio of W:T=0.8:0.2, the crosstalk ratio of the primary image data items to be generated is 0.8:0.2.

<Case where m=m>

In a case where m=2, two primary image data items (the first primary image data and the second primary image data) were generated, and two secondary image data items (the first secondary image data and the second secondary image data) are generated by performing the crosstalk removal processing on the generated two primary image data items.

It was assumed that the crosstalk ratio of the first primary image data is W:T=0.8:0.2 and the crosstalk ratio of the second primary image data is W:T=0.2:0.8.

Figure 33:
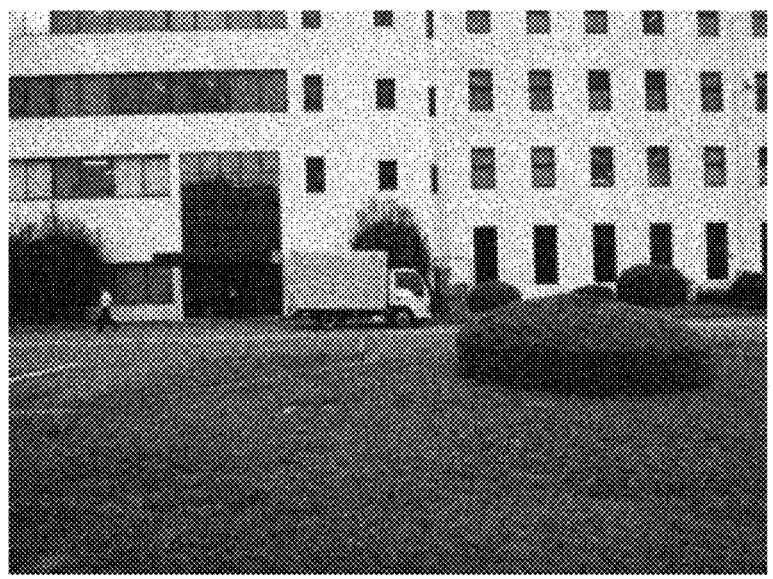
FIG. 33 is an image represented by the first secondary image data generated in a case where m=n.
Figure 34:
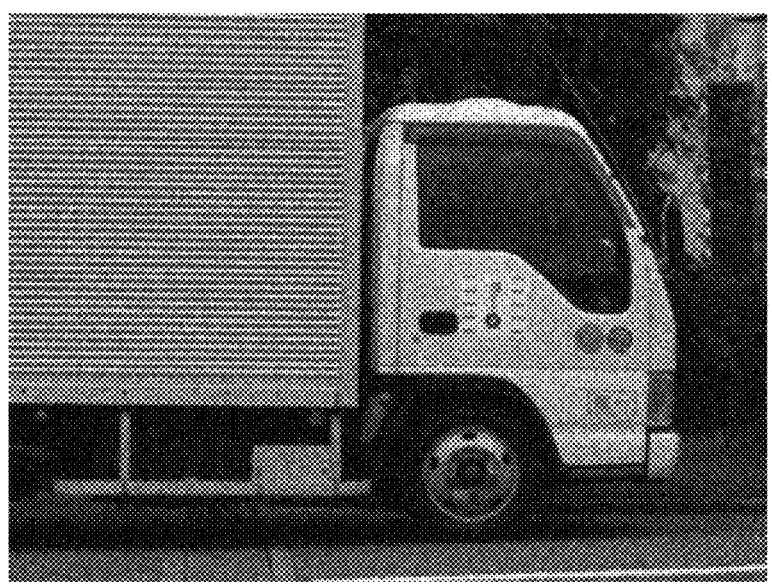
FIG. 34 is an image represented by the second secondary image data generated in a case where m=n.

FIG. 33 is an image represented by the first secondary image data generated in a case where m=n. FIG. 34 is an image represented by the second secondary image data generated in a case where m=n.

<Case where m>n>

In a case where m=9, nine primary image data items (first primary image data, second primary image data, third primary image data, fourth primary image data, fifth primary image data, sixth primary image data, seventh primary image data, eighth primary image data, and ninth primary image data) were generated, and two secondary image data items (the first secondary image data and the second secondary image data) were generated by performing the crosstalk removal processing on the generated nine primary image data items.

It was assumed that the crosstalk ratio of the first primary image data is W:T=0.9:0.1, the crosstalk ratio of the second primary image data is W:T=0.1:0.9, the crosstalk ratio of the third primary image data is W:T=0.8:0.2, the crosstalk ratio of the fourth primary image data is W:T=0.2:0.8, the crosstalk ratio of the fifth primary image data is W:T=0.7:0.3, the crosstalk ratio of the sixth primary image data is W:T=0.3:0.7, the crosstalk ratio of the seventh primary image data is W:T=0.6:0.4, the crosstalk ratio of the eighth primary image data is W:T=0.4:0.6, and the crosstalk ratio of the ninth primary image data is W:T=0.5:0.5.

Figure 35:
FIG. 35 is an image represented by the first secondary image data generated in a case where m>n.
Figure 36:
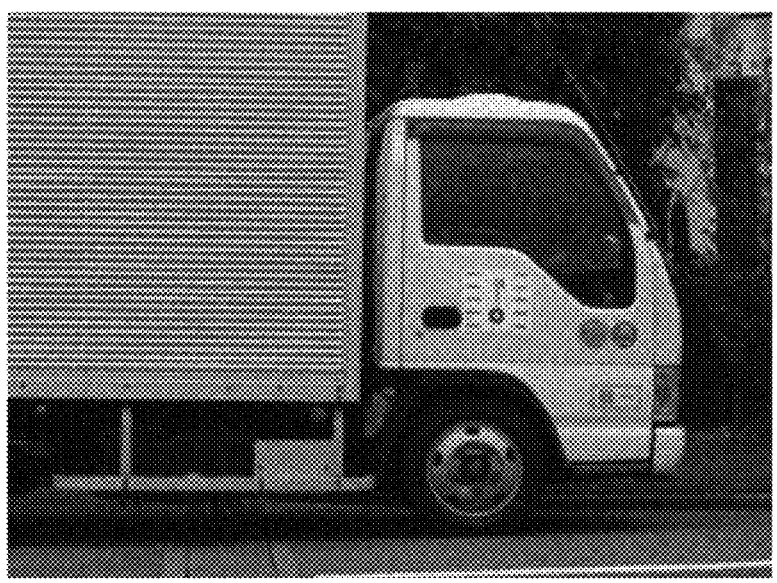
FIG. 36 is an image represented by the second secondary image data generated in a case where m>n.

FIG. 35 is an image represented by the first secondary image data generated in a case where m>n. FIG. 36 is an image represented by the second secondary image data generated in a case where m>n.

<Comparison>

As shown in FIGS. 33 to 36, it is checked that noise can be reduced by setting m>n.

EXPLANATION OF REFERENCES 1 imaging device
10 imaging lens
20 first optical system
22 stop
30 second optical system
30a first lens
30b second lens
30c third lens
30d main mirror
30e secondary mirror
32 stop
40 common lens
100 image sensor
110 pixel
120a first light receiving sensor
120b second light receiving sensor
120c third light receiving sensor
120d fourth light receiving sensor
120e fifth light receiving sensor
120f sixth light receiving sensor
120g seventh light receiving sensor
120h eighth light receiving sensor
120i ninth light receiving sensor
130 photoelectric conversion element
132 microlens
134 light shielding mask
134A opening portion
210: lens driving controller
212: image sensor driving controller
214: analog signal processing unit
216: digital signal processing unit
216A primary image data generation unit
216B secondary image data generation unit
218 display unit
220 work memory
222 storage unit
222A inverse matrix information storage unit
224 media interface
226 system controller
228 operating unit
230 external memory
232 imaging scene information obtaining unit
FI1 first primary image data
FI2 second primary image data
FI3 third primary image data
FI4 fourth primary image data
FI5 fifth primary image data
FI6 sixth primary image data
FI7 seventh primary image data
FI8 eighth primary image data
FI9 ninth primary image data
SI1 first secondary image data
SI2 second secondary image data
L optical axis
L1 region
L2 region
Sβ region
Sα region

What is claimed is:

1. An imaging device comprising:
an imaging lens that includes n number of optical systems of which imaging characteristics are different in which n is an integer satisfying n>1;
an image sensor that includes m number of light receiving sensors of which crosstalk ratios are different in each pixel in which m is an integer satisfying m>n; and
a processor configured to:
obtain image signals from the light receiving sensors of each pixel of the image sensor, and generates m number of primary image data items; and
generate n number of secondary image data items corresponding to the optical systems by performing crosstalk removal processing on the m number of primary image data items for each pixel.

2. The imaging device according to claim 1,
wherein, in a case where pixel values of the primary image data items are $A_1, A_2, \ldots,$ and $A_m$, pixel values of the secondary image data items are $B_1, B_2, \ldots,$ and $B_n$, and the crosstalk ratios are $C_1=C_{11}:C_{12}:\ldots:C_{1n}$, $C_2=C_{21}:C_{22}:\ldots:C_{2n}, \ldots,$ and $C_m=C_{m1}:C_{m2}:\ldots:C_{mn}$, the processor generates the secondary image data items by solving the following simultaneous equations $A_1=C_{11}*B_1+C_{12}*B_2+\ldots+C_{1n}*B_n$, $A_2=C_{21}*B_1+C_{22}*B_2+\ldots+C_{2n}*B_n, \ldots,$ and $A_m=C_{m1}*B_1+C_{m2}*B_2+\ldots+C_{mn}*B_n$, as the crosstalk removal processing.

3. The imaging device according to claim 1,
wherein, in a case where a matrix of m rows×1 column in which pixel values $A_1, A_2, \ldots,$ and $A_m$ of the primary image data items are elements is A, a matrix of n rows×1 column in which pixel values $B_1, B_2, \ldots,$ and $B_n$ of the secondary image data items are elements is B, a matrix of m rows×n columns in which the crosstalk ratios $C_1=C_{11}:C_{12}:\ldots:C_{1n}$, $C_2=C_{21}:C_{22}:\ldots:C_{2n}, \ldots,$ and $C_m=C_{m1}:C_{m2}:\ldots:C_{mn}$ are elements is C, and an inverse matrix of the C is $C^{-1}$, the processor generates the secondary image data items by solving the following matrix equation $B=C^{-1}*A$, as the crosstalk removal processing.

4. The imaging device according to claim 3, wherein the processor further solves the matrix equation by using the information of the inverse matrix $C^{-1}$ stored therein.

5. The imaging device according to claim 4,
wherein the processor stores the information of the inverse matrix $C^{-1}$ for each pixel.

6. The imaging device according to claim 1,
wherein the processor further obtains information of an imaging scene, wherein the processor changes the number of primary image data items to be used in the generation of the secondary image data items depending on the imaging scene.

7. The imaging device according to claim 2,
wherein the processor further obtains information of an imaging scene,
wherein the processor changes the number of primary image data items to be used in the generation of the secondary image data items depending on the imaging scene.

8. The imaging device according to claim 3,
wherein the processor further obtains information of an imaging scene,
wherein the processor changes the number of primary image data items to be used in the generation of the secondary image data items depending on the imaging scene.

9. The imaging device according to claim 4,
wherein the processor further obtains information of an imaging scene,
wherein the processor changes the number of primary image data items to be used in the generation of the secondary image data items depending on the imaging scene.

10. The imaging device according to claim 5,
wherein the processor further obtains information of an imaging scene,
wherein the processor changes the number of primary image data items to be used in the generation of the secondary image data items depending on the imaging scene.

11. The imaging device according to claim 6,
wherein the processor specifies the imaging scene by analyzing the primary image data items.

12. The imaging device according to claim 1,
wherein the light receiving sensor includes
a photoelectric conversion element,
a microlens that forms an image of an emission pupil of the imaging lens on the photoelectric conversion element, and
a light shielding mask that is disposed between the microlens and the light receiving sensor, and
a difference in shape of the light shielding mask and/or image forming characteristics of the microlens causes a difference in the crosstalk ratios.

13. The imaging device according to claim 1,
wherein the light receiving sensor includes
a photoelectric conversion element, and
a microlens that forms an image of an emission pupil of the imaging lens on the photoelectric conversion element, and
a difference in image forming characteristics of the microlens causes a difference in the crosstalk ratios.

14. The imaging device according to claim 1,
wherein the n number of optical systems included in the imaging lens have different focal lengths.

15. The imaging device according to claim 1,
wherein the n number of optical systems included in the imaging lens have different focusing distances.

16. The imaging device according to claim 1,
wherein the n number of optical systems included in the imaging lens have different transmission wavelength characteristics.

17. The imaging device according to claim 14,
wherein the n number of optical systems included in the imaging lens are concentrically disposed.

18. An image data generation method using an imaging device having an imaging lens and an image sensor,
wherein the imaging lens that includes n number of optical systems of which the imaging characteristics are different in which n is an integer satisfying $n>1$, the method comprising:
exposing the image sensor, wherein the image sensor includes m number of light receiving sensors of which crosstalk ratios are different in each pixel in which m is an integer satisfying $m>n$;
obtaining image signals from the light receiving sensors of each pixel of the image sensor and generating m number of primary image data items; and
generating n number of secondary image data items corresponding to the optical systems by performing crosstalk removal processing on the m number of primary image data items for each pixel.

19. The image data generation method according to claim 18,
wherein, in a case where pixel values of the primary image data items are $A1, A2, \ldots,$ and $Am$, pixel values of the secondary image data items are $B1, B2, \ldots,$ and $Bn$, and the crosstalk ratios are $C1=C11:C12:\ldots:C1n$, $C2=C21:C22:\ldots:C2n, \ldots,$ and $Cm=Cm1:Cm2:\ldots:Cmn$, the secondary image data items are generated by solving the following simultaneous equations $A1=C11*B1+C12*B2+\ldots+C1n*Bn$, $A2=C21*B1+C22*B2+\ldots+C2n*Bn, \ldots,$ and $Am=Cm1*B1+Cm2*B2+\ldots+Cmn*Bn$, as the crosstalk removal processing.

20. The image data generation method according to claim 18,
wherein, in a case where a matrix of m rows×1 column in which pixel values $A1, A2, \ldots,$ and $Am$ of the primary image data items are elements is $A$, a matrix of n rows×1 column in which pixel values $B1, B2, \ldots,$ and $Bn$ of the secondary image data items are elements is $B$, a matrix of m rows×n columns in which the crosstalk ratios $C1=C11:C12:\ldots:C1n$, $C2=C21:C22:\ldots:C2n, \ldots,$ and $Cm=Cm1:Cm2:\ldots:Cmn$ are elements is $C$, and an inverse matrix of the $C$ is $C^{-1}$, the secondary image data items are generated by solving the following matrix equation $B=C^{-1}*A$, as the crosstalk removal processing.

* * * * *